(12) United States Patent
Lee

(10) Patent No.: US 7,075,470 B2
(45) Date of Patent: Jul. 11, 2006

(54) RAMP GENERATORS FOR IMAGER ANALOG-TO-DIGITAL CONVERTERS

(75) Inventor: Yan Lee, Surrey (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/055,102

(22) Filed: Feb. 11, 2005

(65) Prior Publication Data
US 2006/0125673 A1    Jun. 15, 2006

(30) Foreign Application Priority Data
Dec. 15, 2004  (GB) ................. 0427469.2

(51) Int. Cl.
*H03M 1/12*    (2006.01)
(52) U.S. Cl. ..................... 341/155; 382/218
(58) Field of Classification Search ............... 341/155, 341/167, 168; 382/218, 219, 207
See application file for complete search history.

(56) References Cited

U.S. PATENT DOCUMENTS

| | | | |
|---|---|---|---|
| 5,295,158 A | | 3/1994 | Jordan |
| 6,088,490 A | * | 7/2000 | Iwata et al. ................. 382/312 |
| 6,137,432 A | | 10/2000 | Xiao |
| 6,271,785 B1 | * | 8/2001 | Martin et al. ................ 341/169 |
| 6,346,907 B1 | | 2/2002 | Dacy et al. |
| 6,384,806 B1 | * | 5/2002 | Matsueda et al. ............. 345/89 |
| 6,469,687 B1 | * | 10/2002 | Janssen ........................ 345/94 |
| 6,867,804 B1 | * | 3/2005 | Kim et al. ................... 348/294 |
| 2002/0118289 A1 | * | 8/2002 | Choi ........................... 348/308 |
| 2003/0193595 A1 | * | 10/2003 | Henderson ................... 348/308 |

FOREIGN PATENT DOCUMENTS

| | | |
|---|---|---|
| EP | 0 205 140 A3 | 9/1986 |
| EP | 1 351 490 A1 | 8/2003 |

OTHER PUBLICATIONS

H. Eltoukhy et al., "A 0.18 um CMOS $10^6$ lux Bioluminescence Detection System-on-Chip", ISSCC 2004 / Session 12 / Biomicrosystems / 12.3.

* cited by examiner

*Primary Examiner*—Peguy JeanPierre
(74) *Attorney, Agent, or Firm*—Dickstein Shapiro Morin & Oshinsky LLP

(57) ABSTRACT

An imager with an analog-to-digital converter having at least one ramp generator that precisely and efficiently produces the desired ramp voltages required by the analog-to-digital converter. The analog-to-digital converter can use differential or two ramp generators. The analog-to-digital converter can also use ramp generators operated in linear or compressed ramp modes.

74 Claims, 15 Drawing Sheets

US 7,075,470 B2

RAMP GENERATORS FOR IMAGER ANALOG-TO-DIGITAL CONVERTERS

FIELD OF THE INVENTION

The invention relates generally to imaging devices and more particularly to ramp generators for analog-to-digital converters used in imaging devices.

BACKGROUND

A CMOS imager circuit includes a focal plane array of pixel cells, each one of the cells including a photosensor, for example, a photogate, photoconductor or a photodiode overlying a substrate for accumulating photo-generated charge in the underlying portion of the substrate. Each pixel cell has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the necessary functions of: (1) photon to charge conversion;

(2) accumulation of image charge; (3) resetting the storage region to a known state before the transfer of charge to it; (4) transfer of charge to the storage region accompanied by charge amplification; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

CMOS imagers of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524 and U.S. Pat. No. 6,333,205, assigned to Micron Technology, Inc., which are hereby incorporated by reference in their entirety.

A typical four transistor (4T) CMOS imager pixel 10 is shown in FIG. 1. The pixel 10 includes a photosensor 12 (e.g., photodiode, photogate, etc.), transfer transistor 14, floating diffusion region FD, reset transistor 16, source follower transistor 18 and row select transistor 20. The photosensor 12 is connected to the floating diffusion region FD by the transfer transistor 14 when the transfer transistor 14 is activated by a transfer gate control signal TX.

The reset transistor 16 is connected between the floating diffusion region FD and an array pixel supply voltage Vaa_pix. A reset control signal RST is used to activate the reset transistor 16, which resets the floating diffusion region FD to the array pixel supply voltage Vaa_pix level as is known in the art.

The source follower transistor 18 has its gate connected to the floating diffusion region FD and is connected between the array pixel supply voltage Vaa_pix and the row select transistor 20. The source follower transistor 18 converts the charge stored at the floating diffusion region FD into an electrical output voltage signal Vout. The row select transistor 20 is controllable by a row select signal SEL for selectively connecting the source follower transistor 18 and its output voltage signal Vout to a column line 22 of a pixel array.

The signals output from the pixel 10 are analog voltages representing a reset signal Vrst (generated when the floating diffusion region FD is reset) and a pixel output signal Vsig generated after charge from the photodiode 12 is transferred to the floating diffusion region FD. The output signals must be converted from analog to digital for further processing. Thus, the pixel output signals Vrst, Vsig are usually sent to a sample and hold circuit and then to a differencing circuit, which forms the signal Vrst-Vsig. This difference signal is then sent to an analog-to-digital converter (ADC) (not shown in FIG. 1). Many CMOS image sensors use a ramp analog-to-digital converter, which is essentially a comparator and associated control logic. In the conventional ramp analog-to-digital converter, an input voltage of the signal to be converted is compared with a gradually increasing reference voltage. The gradually increasing reference voltage is generated by a digital-to-analog converter (DAC) as it sequences through and converts digital codes into analog voltages. This gradually increasing reference voltage is known as the ramp voltage. In operation, when the ramp voltage reaches the value of the input voltage, the comparator generates a signal that latches the digital code of the DAC. The latched digital code is used as the output of the analog-to-digital converter.

In high resolution CMOS imaging applications, for example, column-parallel analog-to-digital converters are being increasingly used as the preferred method of converting the charge captured by the CMOS sensors to the digital outputs. The single-slope analog-to-digital conversion techniques employed so far have some benefits such as e.g., good linearity and simple implementation. This type of conversion, however, is slow and for analog-to-digital converters with a 12-bit or more resolution, higher performance is needed. In today's imagers where the resolution is approximately 4 mega-pixels or more, this becomes a major issue. Accordingly, there is a need and desire for higher performance analog-to-digital converters used in imagers.

To achieve high conversion rates, a modulating ramp analog-to-digital conversion technique has been proposed. This technique, however, requires complex square-root modulation to follow photon noise characteristics. Current ramp generators have a number of limitations and one of them is the non-programmability of the break points of the ramp curve. Accordingly, there is a need and desire for modulating ramp analog-to-digital converters that have programmable break points.

An advantage of the column-parallel analog-to-digital converter is its ability to have more than one mode of data conversion. This adds flexibility and performance and is achieved by changing the shape of the ramp. Currently, however, a multi-mode ramp generator that does not adversely impact the overall performance of the analog-to-digital converter has not been satisfactorily achieved. Accordingly, there is a need and desire for a multi-mode ramp generator that does not adversely impact the overall performance of the analog-to-digital converter.

SUMMARY

The invention provides a ramp generator for a high performance, high resolution analog-to-digital converter for use with imaging devices.

The invention also provides a modulating ramp generator for an analog-to-digital converter that has programmable break points.

The invention further provides a multi-mode ramp generator that does not adversely impact the overall performance of the analog-to-digital converter.

The above and other features and advantages are achieved in various exemplary embodiments of the invention by providing an imager with an analog-to-digital converter having at least one ramp generator that precisely and efficiently produces the desired ramp voltages required by the analog-to-digital converter. The analog-to-digital converter can use differential or two ramp generators. The analog-to-digital converter can also use ramp generators operated in linear or compressed ramp modes.

In one embodiment, a differential analog-to-digital converter uses rising and falling ramp generators to create the necessary ramp voltages needed to convert pixel and reset signals into a digital code representing the light impinging on the pixels.

In other embodiments, the analog-to-digital converter uses a multi-mode ramp generator to obtain the desired resolution for the intended application. The ramp generator is based on 1 LSB unit cells that are efficiently implemented to reduce chip area and consume less power than other ramp generators.

In another embodiment, the multi-mode ramp generator is configured to have programmable break points by switching current sources into the generator at the appropriate time.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION

Figure 2:
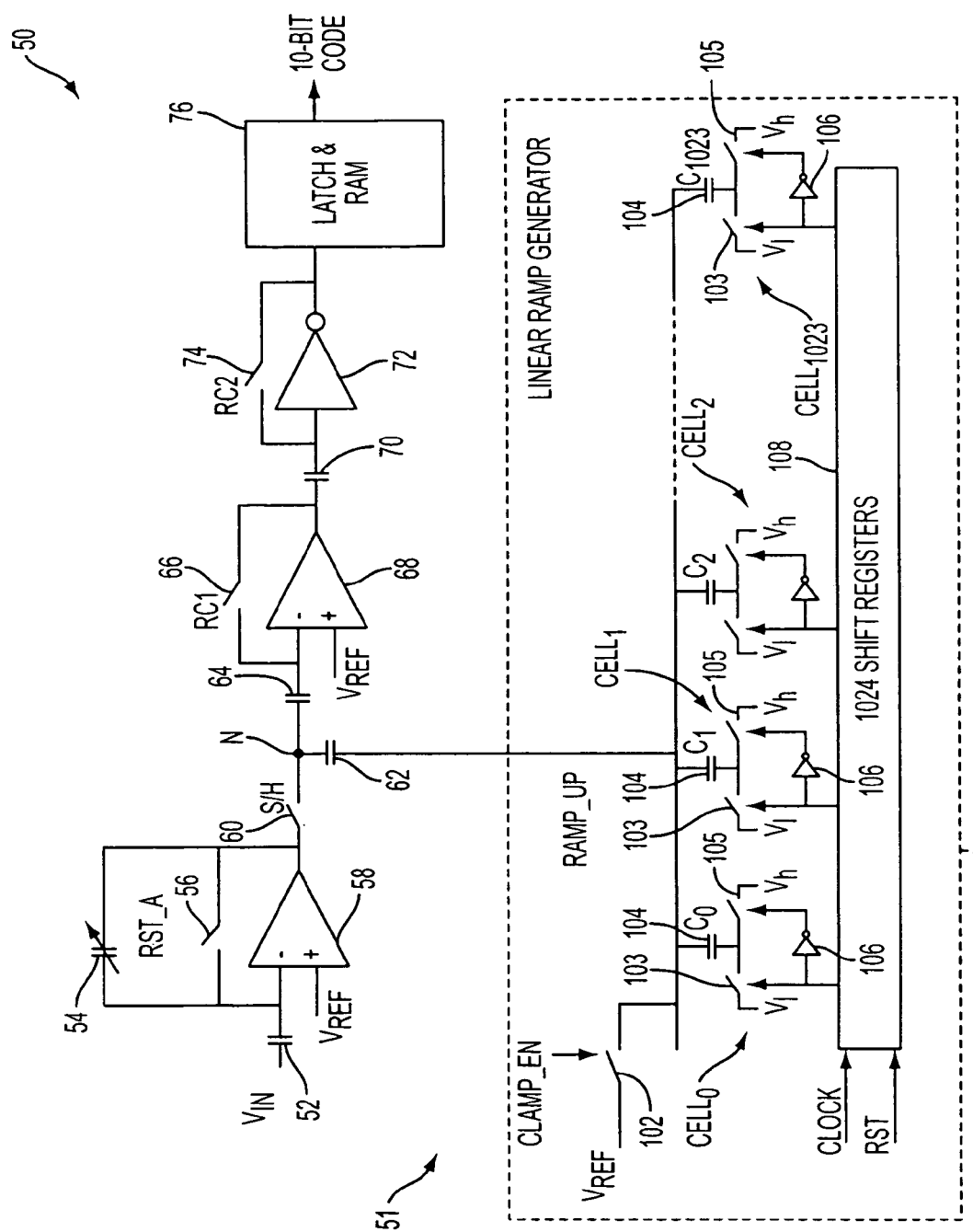
FIG. 2 illustrates a single-slope column parallel analog-to-digital converter.

FIG. 2 illustrates a single-slope column parallel analog-to-digital converter 50. The illustrated analog-to-digital converter 50 includes a conversion portion 51 connected to a linear ramp generator 100. The conversion portion 51 includes a first amplifier 58, comparator 68, second amplifier 72 (implemented as an inverter), latching/RAM logic 76, three switches 56, 66, 74, four capacitors 52, 62, 64, 70 and a variable capacitor 54.

The first amplifier 58 receives at its inverting input an analog voltage input Vin (through the first capacitor 52). The first amplifier 58 receives at its non-inverting input an analog reference voltage Vref. The output of the first amplifier 58 is fed back through the variable capacitor 54 or the first switch 56 (when closed by a first reset signal RST_A). This feedback path adjusts the gain settings of the first amplifier 58. The output of the first amplifier 58 is also connected to a node N via the second switch 60 (when closed by a sample and hold signal S/H). The second and third capacitors 62, 64 are also connected to the node N.

The inverting input of the comparator 68 is connected to the third capacitor 64. The non-inverting input of the comparator 68 is connected to the reference voltage Vref. The output of the comparator 68 is fed back to its inverting input when the third switch 66 is closed (when a first control signal RC1 is applied). The third switch 66 is closed to bias the comparator 68 before the ramp generator 100 starts outputting the ramp voltage RAMP_UP. The biasing is used in effect to prime the triggering mechanism of the comparator 68. The output of the comparator 68 is connected to the fourth capacitor 70, which is connected to the input of the second amplifier 72.

The output of the second amplifier 72 is fed back to its input when the fourth switch is closed (when a second control signal RC2 is applied). The fourth switch 74 is closed to bias the second amplifier 72 before the ramp generator 100 starts outputting the ramp voltage RAMP_UP. The biasing is used in effect to prime the triggering mechanism of the second amplifier 72. The output of the second amplifier 72 is also connected to the latch/RAM logic 76, which is responsible for performing noise filtering and latching a 10-bit digital code into a random access memory (RAM). The 10-bit digital code represents the analog input signal Vin and is generated by the ramp generator 100. It should be noted that the circuitry for generating the 10-bit code is not shown, but would be connected to the latch/RAM logic 76.

The linear ramp generator 100 includes a clamp switch 102, a plurality (e.g., 1024) of ramp unit cells $CELL_0$, $CELL_1$, $CELL_2$, ..., $CELL_{1023}$, and a plurality of shift registers 108 connected to the unit cells $CELL_0$, $CELL_1$, $CELL_2$, ..., $CELL_{1023}$. In operation, the clamp switch 102 is used to force the ramp output voltage RAMP_UP from the generator 100 to achieve a full voltage swing (i.e., to ensure that the ramp output voltage RAMP_UP spans all possible output voltages).

Each cell $CELL_0$, $CELL_1$, $CELL_2$, ..., $CELL_{1023}$ includes two switches 103, 105, a capacitor 104, an inverter 106 and a shift register from the shift registers 108. The shift registers 108 each receive a clock signal CLOCK and a reset signal RST and provide output signals to the cells $CELL_0$, $CELL_1$, $CELL_2$, ..., $CELL_{1023}$. The shift registers 108 have a reset function. Each register performs a one-shot function to activate the charge-sharing capacitor connected to it and to arm the next ramp unit cell $CELL_0$, $CELL_{11}$ $CELL_2$, ..., $CELL_{1023}$. The first switch 103 (when closed based on the output from the shift registers 108) connects a low voltage V1 to the capacitor 104. The second switch 105 (when closed based on an inverted output from the shift registers 108) connects a high voltage Vh to the capacitor 104. The combined outputs from the cells $CELL_0$, $CELL_1$, $CELL_2$, ..., $CELL_{1023}$ forms the ramp output voltage RAMP_UP, which is applied to the node N (via the second capacitor 62).

In operation, an analog input voltage Vin is input by the first amplifier 58, amplified and output to node N (when the sample and hold signal S/H closes the second switch 60). This places the input voltage Vin across the second and third capacitors 62, 64. Thus, at this time, the analog input voltage Vin is held/shared by the second and third capacitors 62, 64. When the ramp generator 100 is activated, each ramp cell $CELL_0$, $CELL_1$, $CELL_2$, ..., $CELL_{1023}$ is turned on one at a time over the course of 1024 clock cycles. This charges the capacitors 104 of the activated cells $CELL_0$, $CELL_1$, $CELL_2$, ..., $CELL_{1023}$. The ramp output voltage RAMP_UP is applied to the second capacitor 62, which changes the voltage seen at the node N. When the ramp output voltage RAMP_UP causes the voltage at the node N to be greater than the reference voltage Vref, the comparator output flips (the fourth capacitor 70 provides AC coupling, which allows the comparator output to flip in an optimal manner). The flipped comparator output is amplified by the second amplifier 72, which causes the latch/RAM logic 76 to latch and store the corresponding 10-bit digital code.

Figure 3:
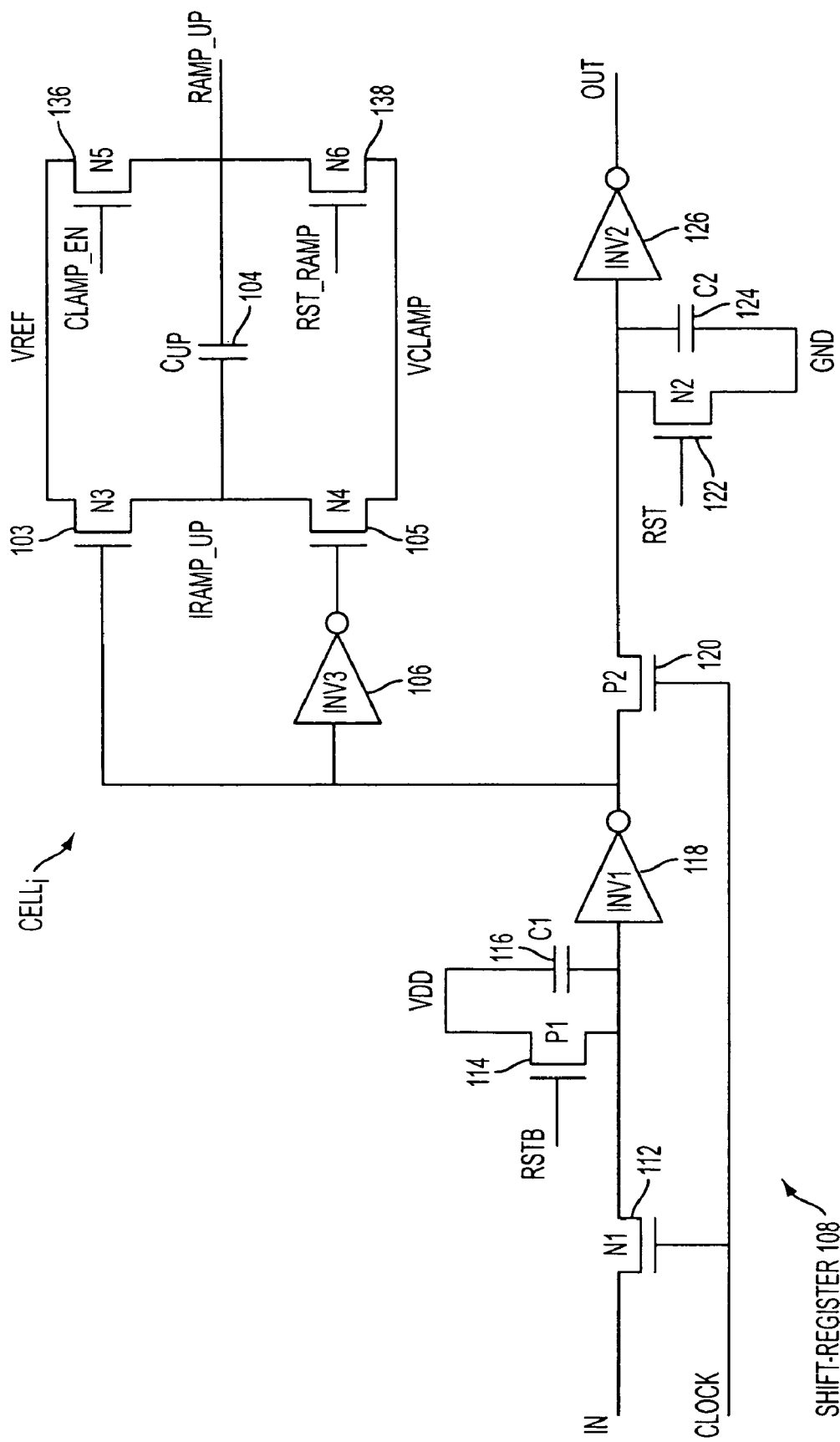
FIG. 3 illustrates a single-slope ramp cell used in the single-slope column parallel analog-to-digital converter of FIG. 2.

FIG. 3 illustrates a single-slope ramp cell $CELL_i$ used in the single-slope column parallel analog-to-digital converter 50 illustrated in FIG. 2. The cell $CELL_i$ includes six n-channel transistors 112, 122, 103, 105, 136, 138, two p-channel transistors 114, 120, three inverters 118, 126, 106 and three capacitors 116, 124, 104.

The shift register portion 108 of the cell $CELL_i$ includes the first and second n-channel transistors 112, 122, first and second p-channel transistors 114, 120, first and second inverters 118, 126 and the first and second capacitors 116, 124. The shift register 108 receives a clock signal CLOCK and an input signal IN and generates an output signal OUT. The output signal OUT of one shift register is connected to be the input IN of the next successive shift register.

The first n-channel transistor 112 has its gate connected to receive the clock signal CLOCK. The first n-channel transistor 112 is connected between the input signal IN and the input of the first inverter 118. The first p-channel transistor 114 is connected between a voltage source VDD and the connection between the first n-channel transistor 112 and the input of the first inverter 118. The first capacitor 116 is connected across the first p-channel transistor 114 and thus, is also connected between the voltage source VDD and the connection between the first n-channel transistor 112 and the input of the first inverter 118. The gate of the first p-channel transistor 114 is connected to a reset signal RSTB.

The second p-channel transistor 120 has its gate connected to the clock signal CLOCK. The second p-channel transistor 120 is connected between the output of the first inverter 118 and the input of the second inverter 126. The second n-channel transistor 122 is connected between a ground potential GND and the connection between the second p-channel transistor 120 and the input of the second inverter 126. The second capacitor 124 is connected across the second n-channel transistor 122 and thus, is also connected between the ground potential GND and the connection between the second p-channel transistor 120 and the input of the second inverter 126. The gate of the second n-channel transistor 122 is connected to another reset signal RST.

The charge sharing capacitor portion of the cell $CELL_i$ contains the third inverter 106, third, fourth, fifth and sixth n-channel transistors 103, 105, 136, 138 and the third capacitor 104. The third n-channel transistor 103 has its gate connected to the output of the first inverter 118. The input of the third inverter 106 is also connected to the output of the first inverter 118. The output of the third inverter 106 is connected to the gate of the fourth n-channel transistor 105. The third n-channel transistor 103 is connected between the reference voltage Vref and a terminal of the fourth n-channel transistor 105. The fourth n-channel transistor 105 is connected between a clamp voltage Vclamp and a terminal of the third n-channel transistor 103.

The fifth n-channel transistor 136 is connected between the reference voltage Vref and a terminal of the sixth n-channel transistor 138. The sixth n-channel transistor 138 is connected between the clamp voltage Vclamp and a terminal of the fifth n-channel transistor 136. The gate of the fifth n-channel transistor 136 is connected to a clamp enable signal CLAMP_EN. The sixth n-channel transistor 138 has its gate connected to a reset ramp signal RST_RAMP. The third capacitor 104 is connected between the connection of the third and fourth n-channel transistors 103, 105 and the connection of the fifth and sixth n-channel transistors 136, 138.

In operation, the ramp unit cell $CELL_i$ is initially reset having both plates of the third capacitor 104 being held at Vclamp. IRAMP_UP refers to the voltage at the first/bottom plate of the third capacitor 104 while the ramp output voltage RAMP_UP is seen at the second/top plate of the third capacitor 104. The output OUT of the shift register 108 is at VDD. The third capacitor 104 is subsequently released from the reset condition and then the shift register 108 is released from its reset condition. At this point, the ramp unit cell $CELL_i$ is ready to perform its ramping function.

When the input signal IN is set low and latched by the rising edge of the clock signal CLOCK. This switches IRAMP_UP (i.e., the first/bottom plate of the third capacitor 104) to the reference voltage Vref. The second or output plate of the third capacitor 104 follows the change in IRAMP_UP. Thus, the ramp output voltage RAMP_UP follows IRAMP_UP. Charge is shared with all other ramp capacitors (FIG. 2) and the combined ramp output RAMP_UP would increase by one unit amount per clock cycle. At the end of the ramping operation, the clamp enable signal CLAMP_EN is generated, which forces the ramp output RAMP_UP to the reference voltage Vref to ensure a full scale output.

The illustrated analog-to-digital converter 50 and ramp unit cell $CELL_i$ have some drawbacks. For example, for low power supply voltages VDD and high reference voltages Vref, n-channel transistor 103 (e.g., an NMOS transistor) would not be able to fully pull up the first/bottom plate of the third capacitor 104 to Vref. Similar problems exist when trying to clamp the output to Vref using n-channel transistor 136 (e.g., an NMOS transistor).

Figure 4A:
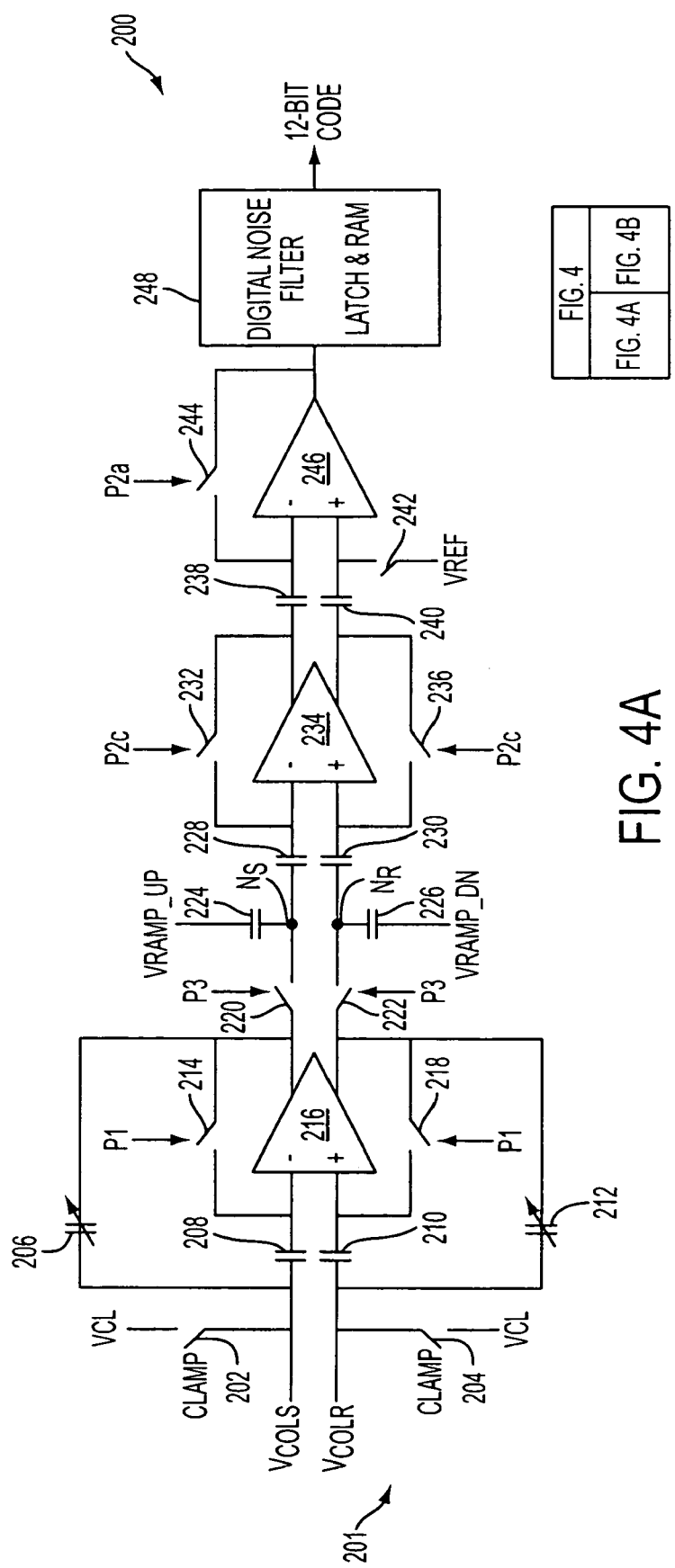
FIG. 4 illustrates a differential column parallel analog-to-digital converter constructed in accordance with an embodiment of the invention.
Figure 4B:
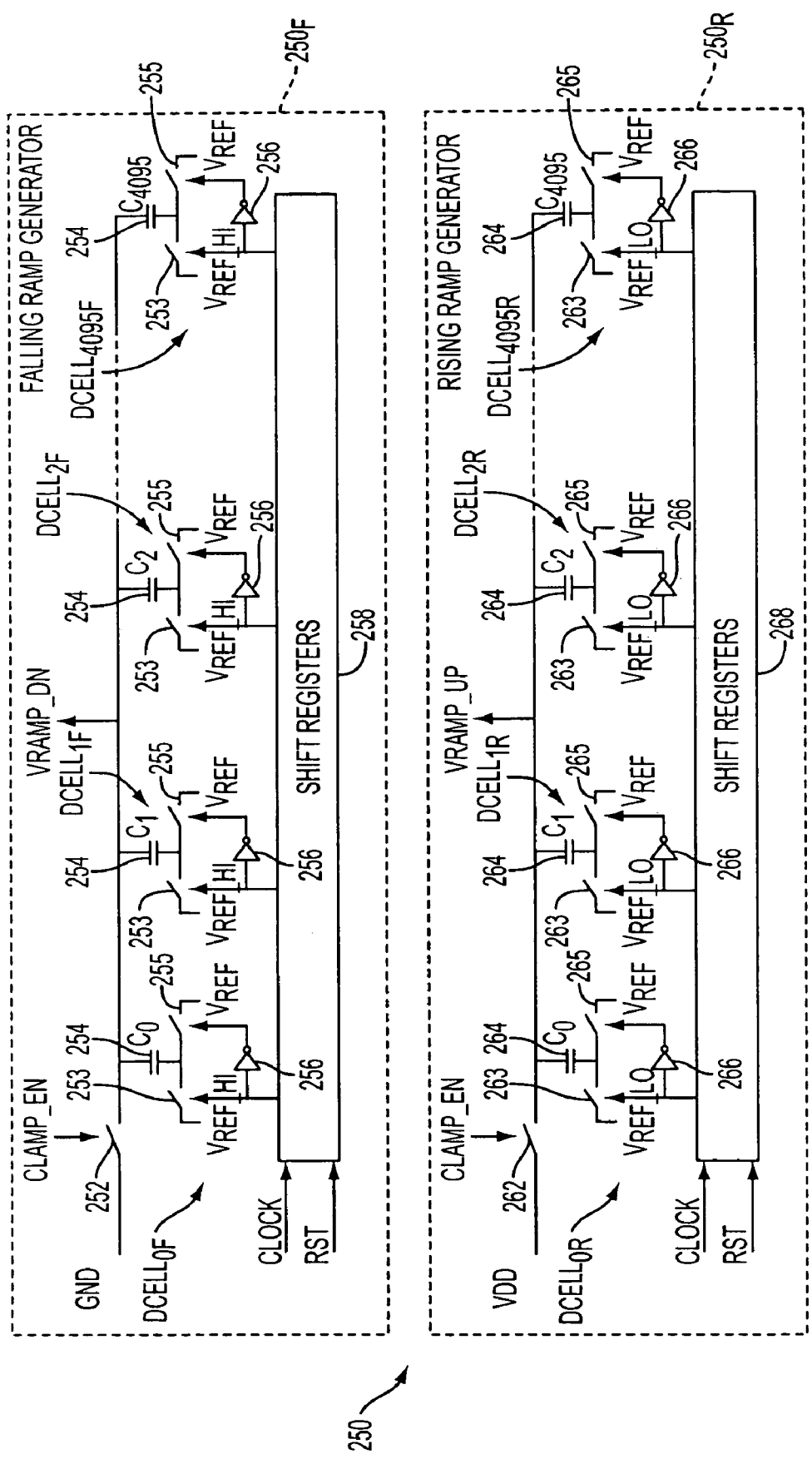

FIG. 4 illustrates a differential column-parallel analog-to-digital converter 200 constructed in accordance with an embodiment of the invention. The illustrated analog-to-digital converter 200 includes a differential conversion portion 201 connected to a differential ramp generator 250 comprising a falling ramp generator $250_f$ and a rising ramp generator $250_r$. As is discussed below in more detail, the analog-to-digital converter 200 uses a differential conversion technique to obtain a 12-bit digital code from analog pixel and reset signals. The conversion portion 201 includes a first amplifier 216, which is a differential amplifier, a differential comparator 234, a second amplifier 246, latching/RAM logic 248, ten switches 202, 204, 214, 218, 220, 222, 232, 236, 242, 244, eight capacitors 208, 210, 224, 226, 228, 230, 238, 240 and two variable capacitors 206, 212.

The first/differential amplifier 216 receives at its inverting input an analog pixel voltage signal Vcols (through the first capacitor 208). The first/differential amplifier 216 receives at its non-inverting input an analog reset voltage signal Vcolr (through the second capacitor 210). The first switch 202 connects a clamping voltage Vcl to the first capacitor 208 when a clamping signal CLAMP is generated. Likewise, the second switch 204 connects the clamping voltage Vcl to the second capacitor 210 when the clamping signal CLAMP is generated.

The first output of the first/differential amplifier 216 is fed back through the first variable capacitor 206 or the third switch 214 (when closed by a first control signal P1). The second output of the first/differential amplifier 216 is fed back through the second variable capacitor 212 or the fourth switch 218 (when closed by the first control signal P1). These feedback paths adjust the gain settings of the amplifier 216.

The first output of the first/differential amplifier 216 is also connected to a first node $N_s$ via the fifth switch 220 (when closed by a sample and hold signal P3). The third and fifth capacitors 224, 228 are also connected to the first node $N_s$. The second output of the first/differential amplifier 216 is also connected to a second node $N_r$ via the sixth switch 222 (when closed by the sample and hold signal P3). The fourth and sixth capacitors 226, 230 are also connected to the second node $N_r$.

The inverting input of the comparator 234 is connected to the fifth capacitor 228. The non-inverting input of the comparator 234 is connected to the sixth capacitor 230. The first output of the comparator 234 is fed back to its inverting input when the seventh switch 232 is closed (when control signal P2c is applied). The second output of the comparator 234 is fed back to its non-inverting input when the eighth switch 236 is closed (when control signal P2c is applied). The seventh and eighth switches 232, 236 are closed to bias the comparator 234 before the rising ramp generator $250_r$ and falling ramp generator $250_f$ start outputting their respective ramp voltages VRAMP_UP, VRAMP_DN. The biasing is used in effect to prime the triggering mechanism of the comparator 234.

The first output of the comparator 234 is connected to the seventh capacitor 238, which is connected to the inverting input of the second amplifier 246. The second output of the comparator 234 is connected to the eighth capacitor 240, which is connected to the non-inverting input of the second amplifier 246. The reference voltage Vref is also connected to the non-inverting input of the second amplifier 246 via the ninth switch 242.

The output of the second amplifier 246 is fed back to its inverting input when the tenth switch 244 is closed (when control signal P2a is applied). The tenth switch 244 is closed to bias the second amplifier 246 before the rising ramp generator $250_r$ and falling ramp generator $250_s$ start outputting their respective ramp voltages VRAMP_UP, VRAMP_DN. The biasing is used in effect to prime the triggering mechanism of the second amplifier 246. The output of the second amplifier 246 is also connected to the latch/RAM logic 248, which is responsible for performing noise filtering and latching of a 12-bit digital code into a random access memory (RAM). The 12-bit digital code represents the pixel signal value (i.e., the difference between the analog input signals Vcols, Vcolr) and is generated by the ramp generators $250_f$, $250_r$. It should be noted that the circuitry for generating the 12-bit code is not shown, but would be connected to the latch/RAM logic 248. It should be appreciated that the analog-to-digital converter 200 in effect performs correlated double sampling.

The falling ramp generator $250_f$ includes a clamp switch 252, a plurality (e.g., 4096) of ramp unit cells $DCELL_{0f}$, $DCELL_{1f}$, $DCELL_{2f}$, ..., $DCELL_{4095f}$ and a plurality of shift registers 258 connected to the unit cells $DCELL_{0f}$, $DCELL_{1f}$, $DCELL_{2f}$, ..., $DCELL_{4095f}$. The clamp switch 252 is used to force the falling ramp output voltage VRAMP_DN to achieve a full voltage swing (i.e., to ensure that the falling ramp output voltage VRAMP_DN spans all possible output voltages).

Each cell $DCELL_{0f}$, $DCELL_{1f}$, $DCELL_{2f}$, ..., $DCELL_{4095f}$ includes two switches 253, 255, a capacitor 254, an inverter 256 and a shift register from the shift registers 258. The shift registers 258 each receive a clock signal CLOCK and a reset signal RST and provide output signals to the cells $DCELL_{0f}$, $DCELL_{1f}$, $DCELL_{2f}$, ..., $DCELL_{4095f}$. The shift registers 258 have a reset function. Each register performs a one-shot function to activate the charge-sharing capacitor connected to it and to arm the next ramp unit cell $DCELL_{0f}$, $DCELL_{1f}$, $DCELL_{2f}$, ..., $DCELL_{4095f}$. The first switch 253 (when closed based on the output from the shift registers 258) connects a high voltage Vref_hi to the capacitor 254. The second switch 255 (when closed based on an inverted output from the shift registers 258) connects a reference voltage Vref to the capacitor 254. The combined outputs from the cells $DCELL_{0f}$, $DCELL_{1f}$, $DCELL_{2f}$, ..., $DCELL_{4095f}$ forms the falling ramp output voltage VRAMP_DN, which is applied to the second node $N_r$ (via the fourth capacitor 226).

The rising ramp generator $250_r$ includes a clamp switch 262, a plurality (e.g., 4096) of ramp unit cells $DCELL_{0r}$, $DCELL_{1r}$, $DCELL_{2r}$, ..., $DCELL_{4095r}$, and a plurality of shift registers 268 connected to the unit cells $DCELL_{0r}$, $DCELL_{1r}$, $DCELL_{2r}$, ..., $DCELL_{4095r}$. The clamp switch 262 is used to force the rising ramp output voltage VRAMP_UP to achieve a full voltage swing (i.e., to ensure that the rising ramp output voltage VRAMP_UP spans all possible output voltages).

Each cell $DCELL_{0r}$, $DCELL_{1r}$, $DCELL_{2r}$, ..., $DCELL_{4095r}$ includes two switches 263, 265, a capacitor 264, an inverter 266 and a shift register from the shift registers 268. The shift registers 268 each receive a clock signal CLOCK and a reset signal RST and provide output signals to the cells $DCELL_{0r}$, $DCELL_{1r}$, $DCELL_{2r}$, ..., $DCELL_{4095r}$. The shift registers 268 have a reset function. Each register performs a one-shot function to activate the charge-sharing capacitor connected to it and to arm the next ramp unit cell $DCELL_{0r}$, $DCELL_{1r}$, $DCELL_{2r}$, ..., $DCELL_{4095r}$. The first switch 263 (when closed based on the output from the shift registers 268) connects a low voltage Vref_lo to the capacitor 264. The second switch 265 (when closed based on an inverted output from the shift registers 268) connects Vref to the capacitor 264. The combined outputs from the cells $DCELL_{0r}$, $DCELL_{1r}$, $DCELL_{2r}$, . . . , $DCELL_{4095r}$ forms the rising ramp output voltage VRAMP_UP, which is applied to the first node $N_s$ (via the third capacitor 224).

Figure 5:
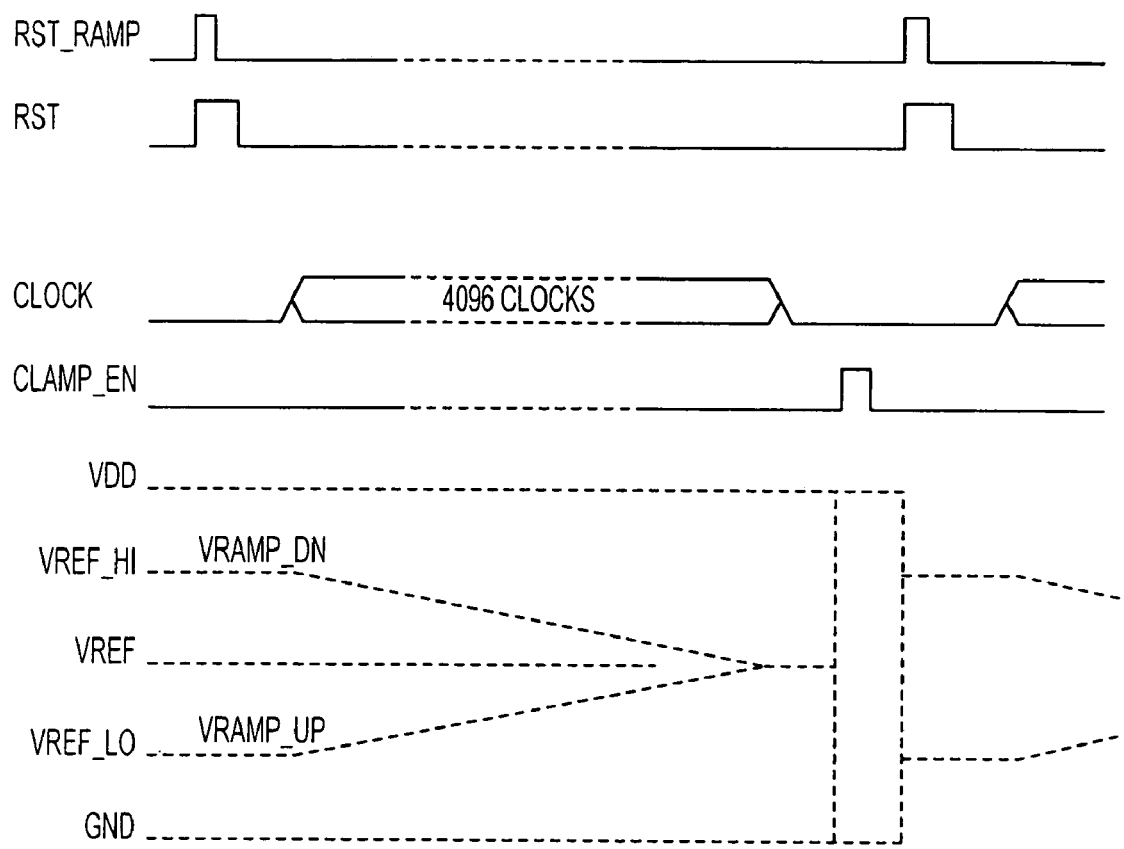
FIG. 5 is an exemplary timing diagram illustrating the operation of the FIG. 4 analog-to-digital converter.

With reference to FIGS. 4 and 5, the operation of the analog-to-digital converter 200 is now described. Initially, all of the ramp cells $DCELL_{0f}$, $DCELL_{1f}$, $DCELL_{2f}$ . . . , $DCELL_{4095f}$, $DCELL_{0r}$, $DCELL_{1r}$, $DCELL_{2r}$, . . . , $DCELL_{4095r}$ are reset (RST_RAMP is applied) causing the capacitors 254, 264 to be set to Vref_hi or Vref_lo. The outputs of the shift registers 258, 268 are reset to VDD (when RST is applied). The capacitors 254, 264 are subsequently released from their reset condition and then the shift registers 258, 268 are released from their reset condition. At this point, the ramp unit cells $DCELL_{0f}$, $DCELL_{1f}$, $DCELL_{2f}$, . . . , $DCELL_{4095f}$, $DCELL_{0r}$, $DCELL_{1r}$, $DCELL_{2r}$, . . . , $DCELL_{4095r}$ are ready to perform their ramping function.

At the start of the ramping operation, the input to the first shift register of the shift registers 258, 268 is forced low. The first shift registers are latched by the first rising edge of the clock signal CLOCK. This switches the bottom plates of the ramp capacitor 254, 264 of the first cells $DCELL_{0f}$, $DCELL_{0r}$ to the reference voltage Vref. The output plates of the capacitors 254, 264 follow the bottom plates. Charge is shared with all of the other ramp capacitors 254, 264 and the outputs increase by one unit. At the same time, the output of the first shift register and thus, the input to the next cell's shift register, is set low. On the next rising edge of the clock signal CLOCK, the second ramp cells $DCELL_{1f}$, $DCELL_{1r}$ are activated and their charge contributes to the ramp outputs VRAMP_DN, VRAMP_UP. This repeats until all ramp cells $DCELL_{0f}$, $DCELL_{1f}$, $DCELL_{2f}$, . . . , $DCELL_{4095f}$, $DCELL_{0r}$, $DCELL_{1r}$, $DCELL_{2r}$, . . . , $DCELL_{4095r}$ are activated. As can be seen from FIG. 5, VRAMP_DN begins at Vref_hi and drops as more cells are activated while VRAMP_UP begins at Vref_lo and increases as more cells are activated. At the end of the ramping operation, the clamp enable signal CLAMP_EN is generated, which forces the ramp outputs VRAMP_UP, VRAMP_DN to VDD or to the ground potential GND, respectively, to ensure a full scale output.

The outputs of the ramp generator 250 may be expressed as follows:

(1) VRAMP_UP=Vref_lo+(Vref−Vref_lo)*N/4096; and (2) VRAMP_DN=Vref_hi−(Vref_hi−Vref)*N/4096, where N is the number of unit ramp cells activated.

It should be appreciated that there may be only one set of shift registers that are shared between the cells $DCELL_{0r}$, $DCELL_{1r}$, $DCELL_{2r}$, . . . , $DCELL_{4095r}$, $DCELL_{0f}$, $DCELL_{1f}$, $DCELL_{2f}$ . . . , $DCELL_{4095f}$ of the rising and falling ramp generators $250_f$, $250_r$.

Figure 6:
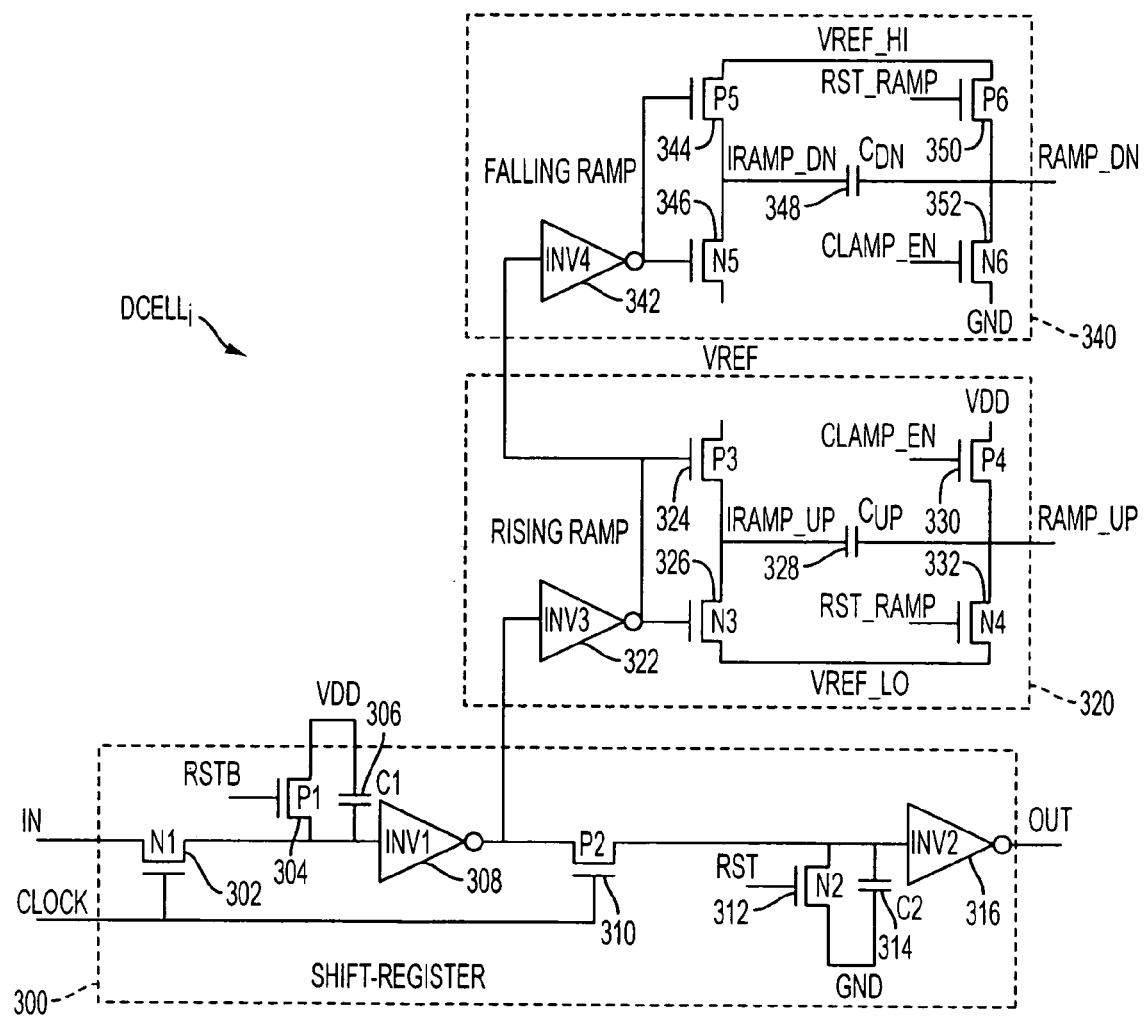
FIG. 6 illustrates a differential output ramp cell used in the differential column parallel analog-to-digital converter of FIG. 4.

FIG. 6 illustrates a differential output ramp cell $DCELL_i$ used in the differential column parallel analog-to-digital converter 200 of FIG. 4. The cell $DCELL_i$ includes six n-channel transistors 302, 312, 326, 332, 346, 352, six p-channel transistors 304, 310, 324, 330, 344, 350, four inverters 308, 316, 322, 342 and four capacitors 306, 314, 328, 348.

The shift register portion 300 of the cell $DCELL_i$ includes the first and second n-channel transistors 302, 312, first and second p-channel transistors 304, 310, first and second inverters 308, 316 and the first and second capacitors 306, 314. The shift register 300 receives a clock signal CLOCK and an input signal IN and generates an output signal OUT. The output signal OUT of one shift register is connected to be the input IN of the next successive shift register.

The first n-channel transistor 302 has its gate connected to receive the clock signal CLOCK. The first n-channel transistor 302 is connected between the input signal IN and the input of the first inverter 308. The first p-channel transistor 304 is connected between a voltage source VDD and the connection between the first n-channel transistor 302 and the input of the first inverter 308. The first capacitor 306 is connected across the first p-channel transistor 304 and thus, is also connected between the voltage source VDD and the connection between the first n-channel transistor 302 and the input of the first inverter 308. The gate of the first p-channel transistor 304 is connected to a reset signal RSTB.

The second p-channel transistor 310 has its gate connected to the clock signal CLOCK. The second p-channel transistor 310 is connected between the output of the first inverter 308 and the input of the second inverter 316. The second n-channel transistor 312 is connected between a ground potential GND and the connection between the second p-channel transistor 310 and the input of the second inverter 316. The second capacitor 314 is connected across the second n-channel transistor 312 and thus, is also connected between the ground potential GND and the connection between the second p-channel transistor 310 and the input of the second inverter 316. The gate of the second n-channel transistor 312 is connected to another reset signal RST.

The charge sharing capacitor portions of the cell $DCELL_i$ contains rising and falling ramp circuitry 320, 340. Specifically, the charge sharing portion includes the third and fourth inverters 322, 342, third, fourth, fifth and sixth n-channel transistors 326, 332, 346, 340, the third, fourth, fifth and sixth p-channel transistors 324, 330, 344, 350 and the third and fourth capacitors 328, 348.

In the rising ramp portion 320, the third n-channel transistor 326 has its gate connected to the output of the third inverter 322. The input of the third inverter 322 is connected to the output of the first inverter 308. The output of the third inverter 322 is also connected to the gate of the third p-channel transistor 324 and the input of the fourth inverter 342 (of the falling ramp portion 340). The third p-channel transistor 324 is connected between the reference voltage Vref and a terminal of the third n-channel transistor 326. The third n-channel transistor 326 is connected between the low reference voltage Vref_lo and a terminal of the third p-channel transistor 324.

The fourth p-channel transistor 330 is connected between VDD and a terminal of the fourth n-channel transistor 332. The fourth n-channel transistor 332 is connected between the low reference voltage Vref_lo and a terminal of the fourth p-channel transistor 330. The gate of the fourth p-channel transistor 330 is connected to a clamp enable signal CLAMP_EN. The fourth n-channel transistor 332 has its gate connected to a reset ramp signal RST_RAMP. The third capacitor 328 is connected between the connection of the third n-channel transistor 326 and the third p-channel transistor 324 and the connection of the fourth n-channel transistor 332 and the fourth p-channel transistor 330.

In the falling ramp portion 340, the fifth n-channel transistor 346 has its gate connected to the output of the fourth inverter 342. The input of the fourth inverter 342 is connected to the output of the third inverter 322. The output of the fourth inverter 342 is also connected to the gate of the fifth p-channel transistor 344. The fifth p-channel transistor 344 is connected between the high reference voltage Vref_hi and a terminal of the fifth n-channel transistor 346. The fifth n-channel transistor 346 is connected between the reference voltage Vref and a terminal of the fifth p-channel transistor 344.

The sixth p-channel transistor 350 is connected between the high reference voltage Vref_hi and a terminal of the sixth n-channel transistor 352. The sixth n-channel transistor 352 is connected between a ground potential GND and a terminal of the sixth p-channel transistor 350. The gate of the sixth n-channel transistor 352 is connected to the clamp enable signal CLAMP_EN. The sixth p-channel transistor 350 has its gate connected to the reset ramp signal RST_RAMP. The fourth capacitor 348 is connected between the connection of the fifth n-channel transistor 346 and the fifth p-channel transistor 344 and the connection of the sixth n-channel transistor 352 and the sixth p-channel transistor 350.

In operation, the ramp unit cell $DCELL_i$ is initially reset having both plates of the third and fourth capacitors 328, 348 being held at Vref_lo or Vref_hi. IRAMP_UP refers to the voltage at the first/bottom plate of the third capacitor 328 while the ramp output voltage RAMP_UP is seen at the second/top plate of the third capacitor 328. Likewise, IRAMP_DN refers to the voltage at the first/bottom plate of the fourth capacitor 348 while the ramp output voltage RAMP_DN is seen at the second/top plate of the fourth capacitor 348. The output OUT of the shift register 300 is at VDD. The third and fourth capacitors 328, 348 are subsequently released from the reset condition and then the shift register 300 is released from its reset condition. At this point, the ramp unit cell $DCELL_i$ is ready to perform its ramping function.

At the start of the ramp operation, the input signal IN is forced low and latched by the rising edge of the clock signal CLOCK. This switches IRAMP_UP (i.e., the voltage at the first/bottom plate of the third capacitor 328) and IRAMP_DN (i.e., the voltage at the first/bottom plate of the fourth capacitor 348) to the reference voltage Vref. The second or output plates of the third and fourth capacitors follow the change in IRAMP_UP and IRAMP_DN, respectively. Thus, the rising ramp output voltage RAMP_UP follows IRAMP_UP and the falling ramp output voltage RAMP_DN follows IRAMP_DN. Charge is shared with all other ramp capacitors and the combined ramp output RAMP_UP increases by one unit amount while the combined RAMP_DN decreases by one unit. At the end of the ramping operation, the clamp enable signal CLAMP_EN is generated, which forces the ramp outputs RAMP_UP and RAMP_DN to the full scale output.

Thus, the illustrated embodiment provides a differential output ramp generator for a high resolution (e.g., 12-bits or more) fully differential column-parallel analog-to-digital converter. Improvements include the use of p-channel transistor 324 to pull IRAMP_UP to Vref and p-channel transistor 330 to clamp RAMP_UP to VDD (instead of Vref). In addition, the falling ramp portion uses the p-channel transistors 344, 350 to reset the fourth capacitor 348 and RAMP_DN to Vref_hi. When needed, the fifth n-channel transistor 346 forces IRAMP_DN to Vref and the output RAMP_DN falls by one step. The sixth n-channel transistor 352 is used to clamp RAMP_DN to GND at the end of the ramping operation. In doing so, the configuration of the present invention is more efficient and accurate than other analog-to-digital converters.

As discussed above, a related problem with today's analog-to-digital converters concerns the inability of having a multi-mode ramp generator that does not impact the overall performance of the ADC. The inventor has determined that the physical layout of the analog-to-digital converter may be improved to provide a multi-mode ramp generator that does not adversely impact the operational performance of the ADC.

Figure 7:
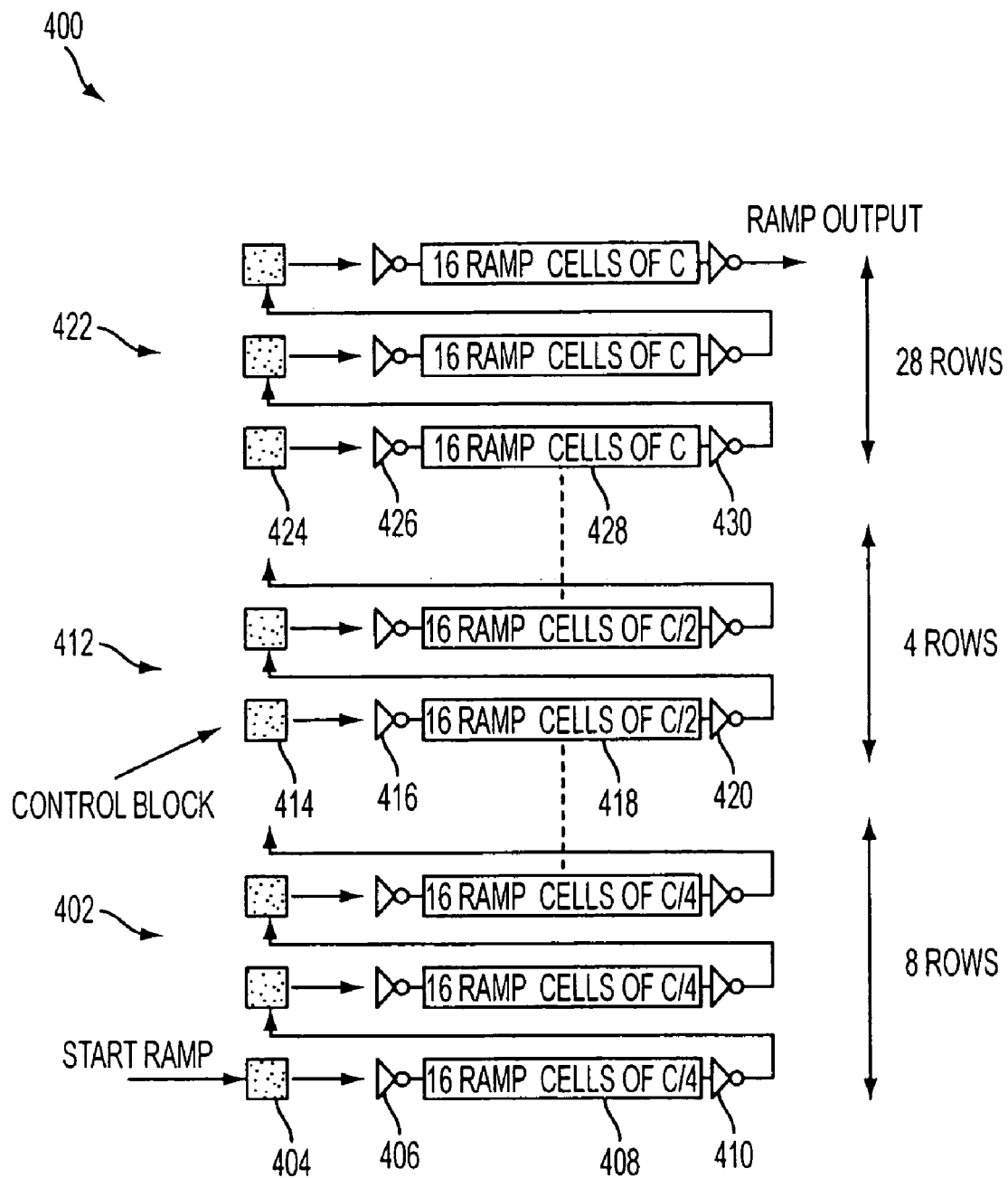
FIG. 7 is a physical implementation of a compressed ramp generator.

FIG. 7 is an example of a physical implementation of a compressed ramp generator 400. The generator 400 is grouped into three portions 402, 412, 422. The first portion 402 contains eight rows of control blocks 404, input buffers 406 (shown as inverters), ramp cell blocks 408, and output buffers 410 (shown as inverters). The ramp cell blocks 408 in the first portion 402 contain sixteen ramp cells having a capacitance unit of C/4. The second portion 412 contains four rows of control blocks 414, input buffers 416, ramp cell blocks 418, and output buffers 420. The ramp cell blocks 418 in the second portion 412 contain sixteen ramp cells having a capacitance unit of C/2. The third portion 422 contains twenty-eight rows of control blocks 424, input buffers 426, ramp cell blocks 428, and output buffers 430. The ramp cell blocks 428 in the third portion 422 contain sixteen ramp cells having a capacitance unit of C.

The ramp cells of the generator 400 are organized in forty rows by sixteen columns. The output of each ramp cell block 408, 418, 428 is fed to the input of the next ramp cell block 408, 418, 428. As can be seen, this requires the portions 402, 412, 422 to contain buffers 410, 420, 430, in the form of inverters, at the output of each ramp cell block 408, 418, 428 to drive the next block. As a result, the illustrated implementation of the generator 400 wastes both power and chip area, which is undesirable.

Figure 8:
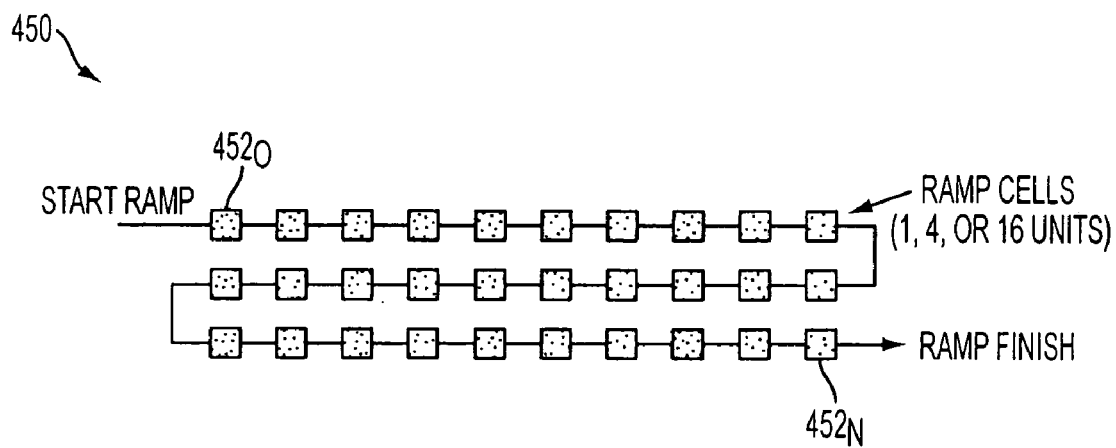
FIG. 8 illustrates a linear mode of operation of a ramp generator constructed in accordance with an embodiment of the invention.
Figure 9:
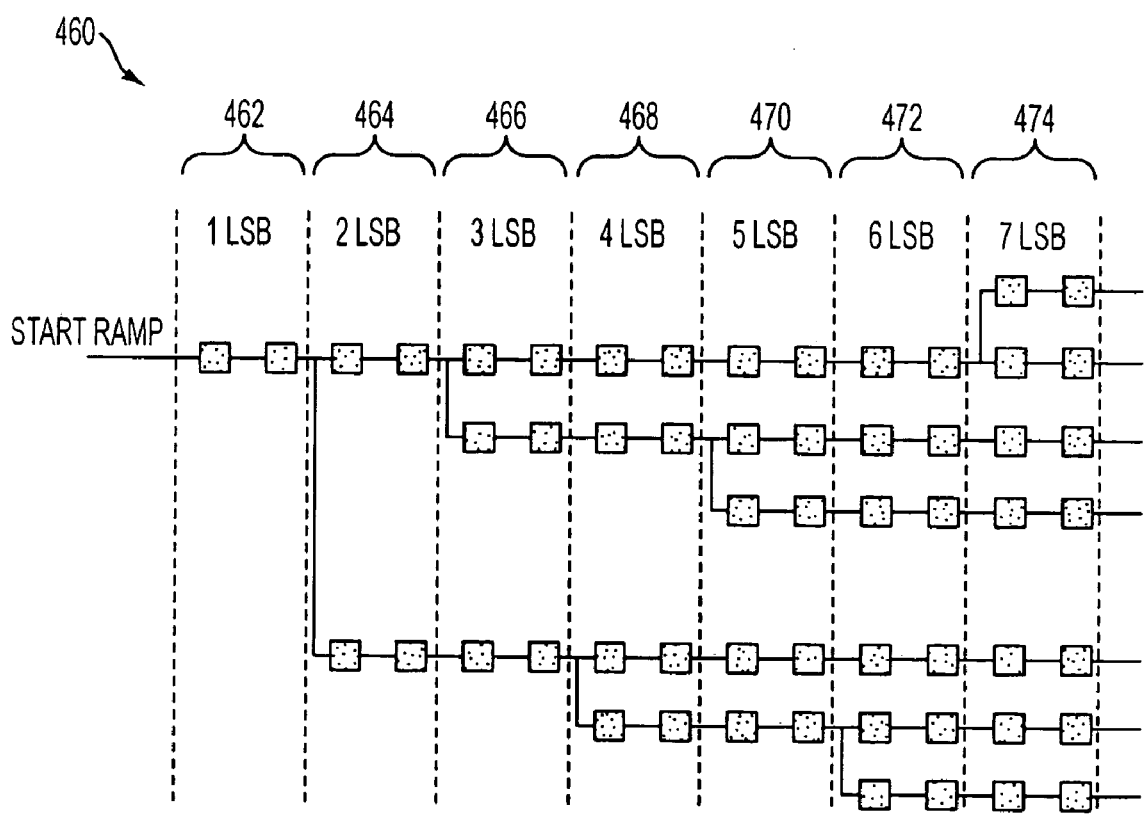
FIG. 9 illustrates a compressed mode of operation of a ramp generator constructed in accordance with an embodiment of the invention.

FIG. 8 illustrates a linear mode 450 for a ramp generator constructed in accordance with an embodiment of the invention and FIG. 9 illustrates the same ramp generator configured in a compressed mode of operation. In actual operation, the ramp generator of the present embodiment has five modes of operation: 12-bit, 10-bit and 8-bit linear, and 12-bit compressed (with either −6 dB or 0 dB noise shaping). Typically, linear modes are used for normal applications where 12-bit linear mode gives the best resolution and slowest frame rate. The 12-bit compressed modes improve frame rates with minimal impact on picture qualities. The minimum number of unit ramp cells required in the illustrated embodiment is 4096. To implement the three linear modes, the ramp cells $452_0, \ldots, 452_n$ are arranged in a daisy chain of 1-unit, 4-unit and 16-unit ramps for the 12-bit, 10-bit and 8-bit ramps, respectively (explained below in more detail).

For the compressed modes, the ramps are organized into linear ramp segments 462, 464, 466, 468, 470, 472, 474 of various step sizes and are configured in a tree structure. It should be noted that each ramp unit cell is a 1 LSB unit cell (same as the cells $452_0, \ldots, 452_n$ shown in FIG. 8). As is described below, however, the 1 LSB unit cells are combined in a manner that produces the illustrated segments 462, 464, 466, 468, 470, 472, 474. As is discussed below in more detail with respect to FIG. 10, the 1 LSB cells are configured by setting switching logic to obtain the desired configuration. The switching logic is controlled by a processor (e.g., image processor) or other companion controller chip connected to the ramp generator.

Specifically, in the illustrated embodiment, the first segment 462 contains unit cells of 1 LSB (i.e., one value of a digital code) connected in a daisy chain similar to the linear mode 450. The second segment 464, however, contains similar 1 LSB unit cells that are connected in a manner that results in 2 LSB combined units (i.e., two values of a digital code). Likewise, the third segment 466 connects the 1 LSB unit cells to form 3 LSB combined cells (i.e., three values of a digital code). The fourth segment 468 configures the 1 LSB unit cells into combined 4 LSB cells, the fifth segment 470 contains combined 5 LSB unit cells, the sixth segment 472 contains combined 6 LSB unit cells, and the seventh segment 474 contains combined 7 LSB unit cells.

The non-linear (i.e., compressed modes) can be expressed as follows:

(3) for n=1 LSB, Framp=2*Cdelta, and (4) for n≧2 LSBs, Framp=Framp$_{(n-1)}$+n*Cdelta, where Cdelta=10 for 0 dB or Cdelta=40 for −6 dB.

Figure 10:
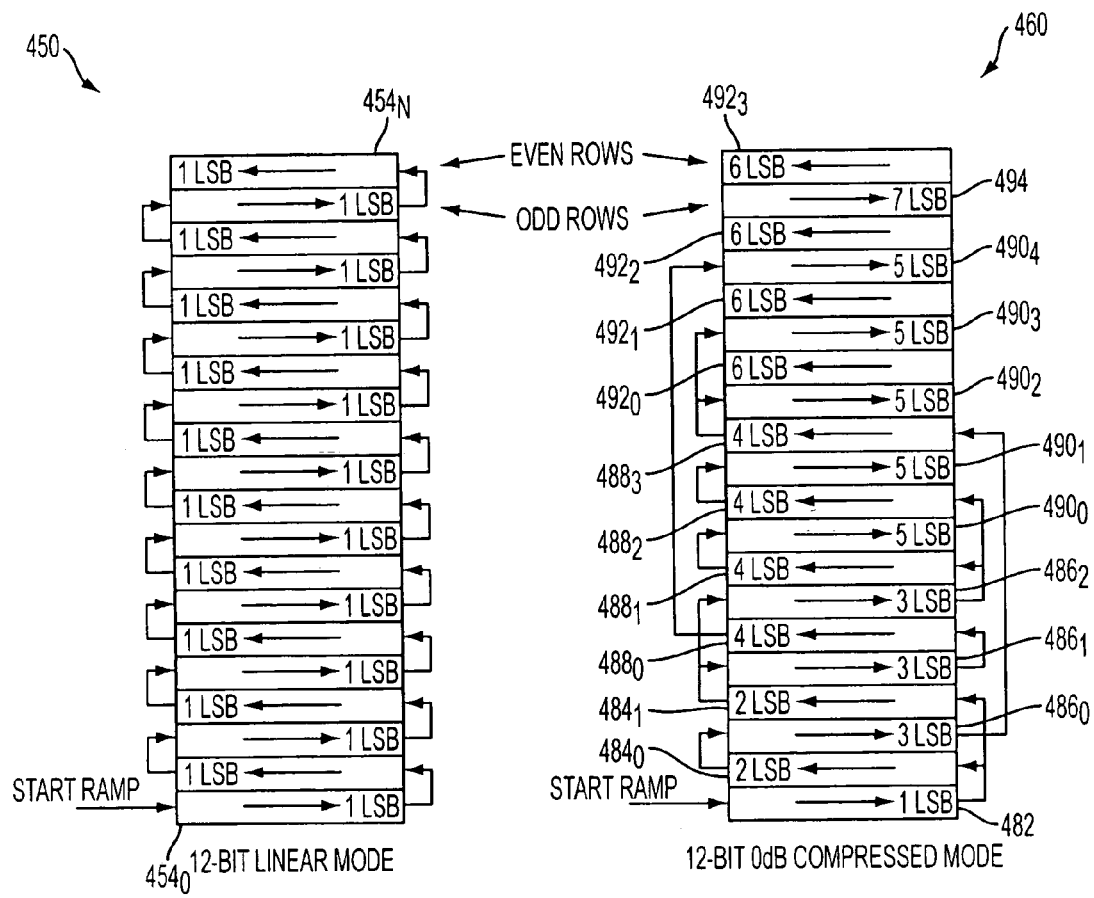
FIG. 10 illustrates a physical implementation of the linear and compressed modes of the ramp generator of the invention.

The physical implementation of the linear 450 and compressed 460 modes of the ramp generator of the invention is illustrated in FIG. 10. The ramp generator consists of 4100 ramp cells, arranged in an array of 10 by 410, and a bank of switches (not shown). Half of the rows are grouped together as odd rows, with the clock input going left-to-right (shown as arrows pointing to the right). The other half of the rows are grouped as even rows, with the clock input going from right-to-left (shown as arrows pointing to the left). This arrangement reduces the length of the connections between the odd and even rows. As a result, no buffers are needed, which reduces the area and power consumption of the generator.

As shown in FIG. 10, the 12-bit linear mode includes rows 454$_0$, 454$_n$ of ten unit cells, each cell having a 1 LSB size. The output from the odd rows are fed into the input of the next even row (for all 210 rows). The 10-bit and 8-bit modes are arranged in a similar fashion, but in steps of 4 and 16 ramp cells, respectively. The ramp is configured using the switches (not shown) or other hardwired selection logic when it is desired to change the mode of the generator (e.g., when a user desires to take still pictures with a desired resolution).

As also shown in FIG. 10, for the 12-bit, 0 dB compressed mode, the first row 482 of 1 LSB cells are fed into two even rows 484$_0$, 484$_1$, which as described above with reference to FIG. 9 forms combined 2 LSB cells. The output from the two even rows 484$_0$, 484$_1$ (i.e., 2 LSB cells) are fed into three odd rows 486$_0$, 486$_1$, 486$_2$, which form combines 3 LSB cells. The output from the three odd rows 486$_0$, 486$_1$, 486$_2$ (i.e., 3 LSB cells) are fed into four even rows 488$_0$, 488$_1$, 488$_2$, 488$_3$, which form combined 4 LSB cells. The output of the four even rows 488$_0$, 488$_1$, 488$_2$, 488$_3$ (i.e., 4 LSB cells) are fed into five odd rows 490$_0$, 490$_1$, 490$_2$, 490$_3$, 490$_4$, combined to form 5 LSB cells. The arrangement continues in this pattern (i.e., even rows 492$_0$, 492$_1$, 492$_2$, 492$_3$, ... forming 6 LSB cells, odd rows 494 forming 7 LSB cells). The 12-bit −6 dB compressed mode is similarly arranged except that the change over from one ramp step to another is after four rows (instead of one). Again, this is performed by the setting of the switches by the companion controller or other processor (e.g., image processor) when it is desired to change mode of the generator (e.g., when a user desires to take digital still picture with a desired resolution).

Thus, the present embodiment provides a multi-mode ramp that utilizes a minimum number of ramp cells. Switching logic, the orientation of the unit cells (i.e., left-to-right and then right-to-left) and the connection of the even and odd rows allows 1 LSB unit cells to be used in an efficient manner and without buffers. As a result, the embodiment uses less power and silicon area than the ramp generator illustrated in FIG. 7. The lone disadvantage of this ramp generator is that the shape of the compressed ramp cannot be altered once it has been implemented. It may be desirable to do so.

Figure 11:
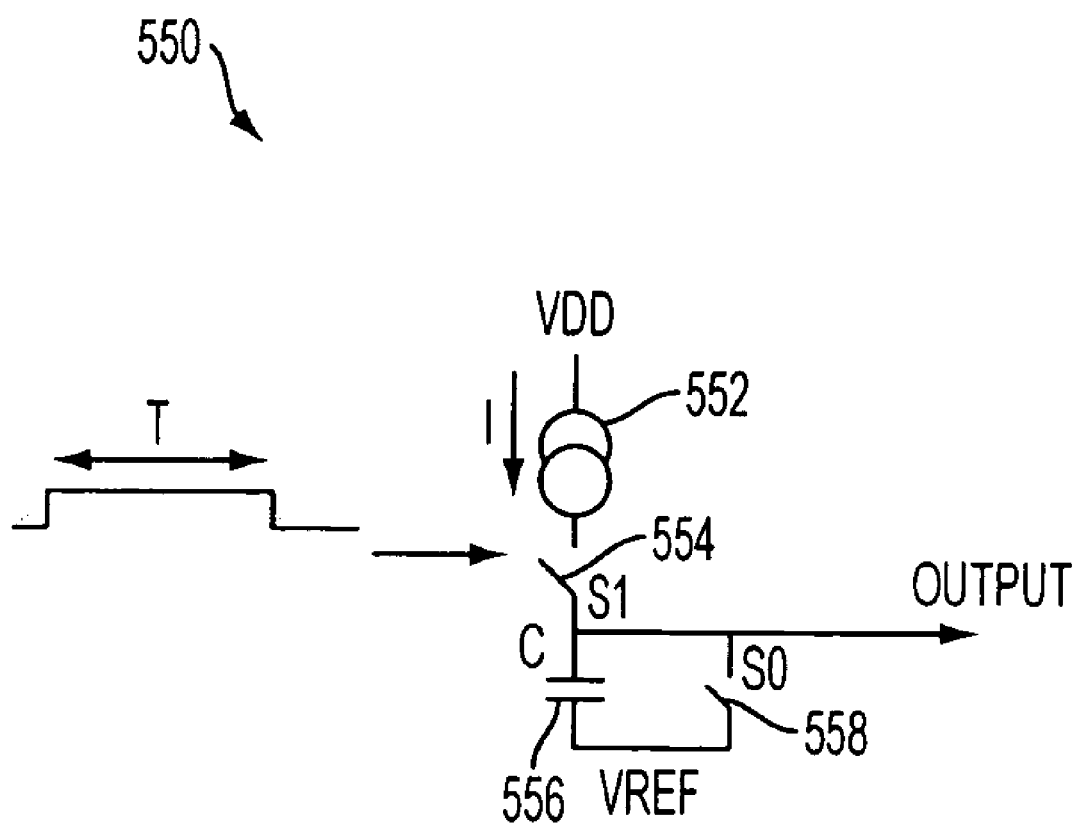
FIG. 11 illustrates a current-capacitor ramp in accordance with an embodiment of the invention.

FIG. 11 illustrates a current-capacitor ramp 550 constructed in accordance with another embodiment of the invention. The ramp 550 includes a constant current source 552, capacitor 556 and two switches 554, 558. In a reset phase, the second switch 558 is closed, which resets the capacitor 556. The output OUTPUT will be at the reference voltage Vref. At the start of the ramp mode, the second switch 558 is opened and the first switch 554 is closed. The capacitor 556 is charged by the current I flowing from the current source 552. The output OUTPUT is:

(5) OUTPUT=Vref+(I*T)/C, where T is the duration of the closure of the first switch 554. Presuming that the current I and the charge C of the capacitor 556 are constant values, then the output OUTPUT is a function of T.

Figure 12A:
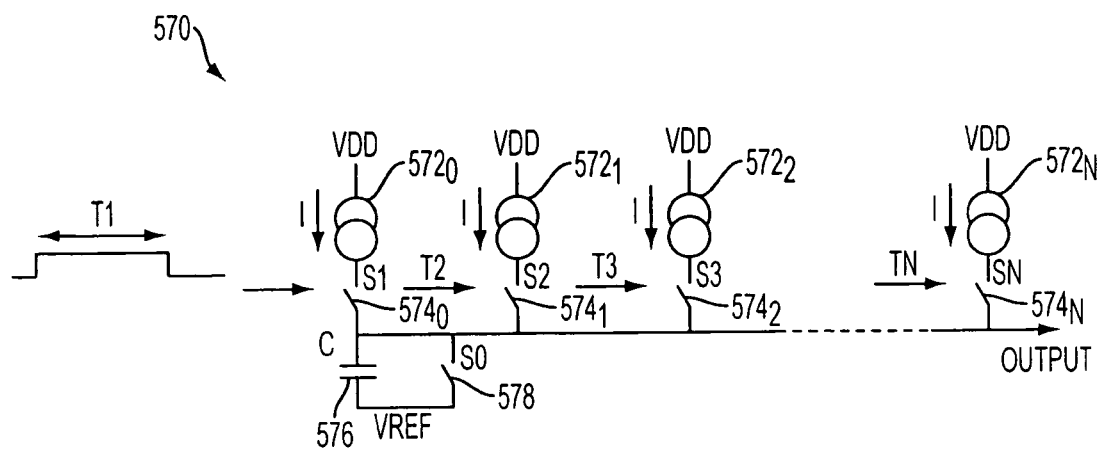
FIG. 12a illustrates a modulation ramp generator constructed in accordance with an embodiment of the invention.
Figure 12B:
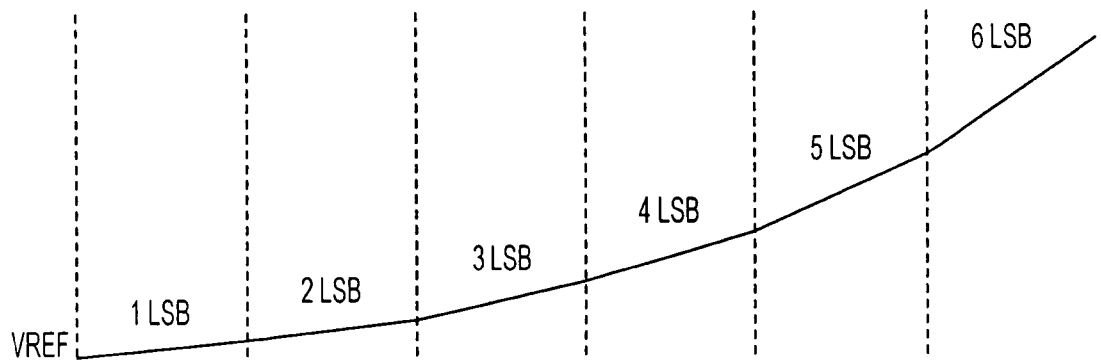
FIG. 12b illustrates a voltage ramp of the modulation ramp generator constructed in accordance with an embodiment of the invention.
Figure 12C:
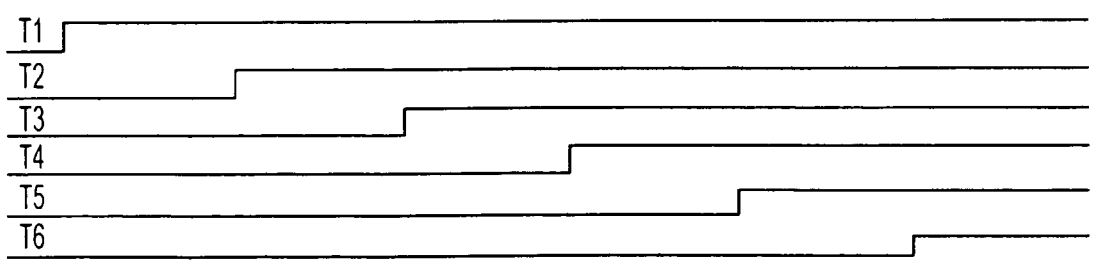
FIG. 12c illustrates a timing diagram of the modulation ramp generator constructed in accordance with an embodiment of the invention.

FIG. 12*a* illustrates a modulation ramp generator 570 constructed in accordance with another embodiment of the invention. The ramp generator 570 includes a plurality of current sources 572$_0$, 572$_1$, 572$_2$, ..., 572$_n$, first switches 574$_0$, 574$_1$, 574$_2$, ..., 574$_n$, a capacitor 576 and a second switch 578. With reference to FIGS. 12*a*, 12*b* and 12*c*, the current sources 572$_0$, 572$_1$, 572$_2$, ..., 572$_n$ are used to form the LSB steps in the ramp modulation. At each break point (represented by the dashed horizontal lined in FIG. 12*b*), one extra current source is added to the ramp 570. This increases the slope of the ramp by one LSB. The duration of the segment and the break points are controlled by the timing on the first switches 574$_0$, 574$_1$, 574$_2$, ..., 574$_n$. The output OUTPUT is determined as follows:

(6) for time 0 to T1, OUTPUT=Vref;

(7) for time T1 to T2, OUTPUT=Vref+I*(T2−T1)/C;

(8) for time T2 to T3, OUTPUT=Vref+I*(T2−T1)/C+2*I(T3−T2)/C; and (9) for time T$_{n-1}$ to T$_n$, OUTPUT=Vref+I*(T2−T1)/C+2*I(T3−T2)/C+ ... (n−1)*I*(T$_n$−T$_{n-1}$)/C.

Figure 13:
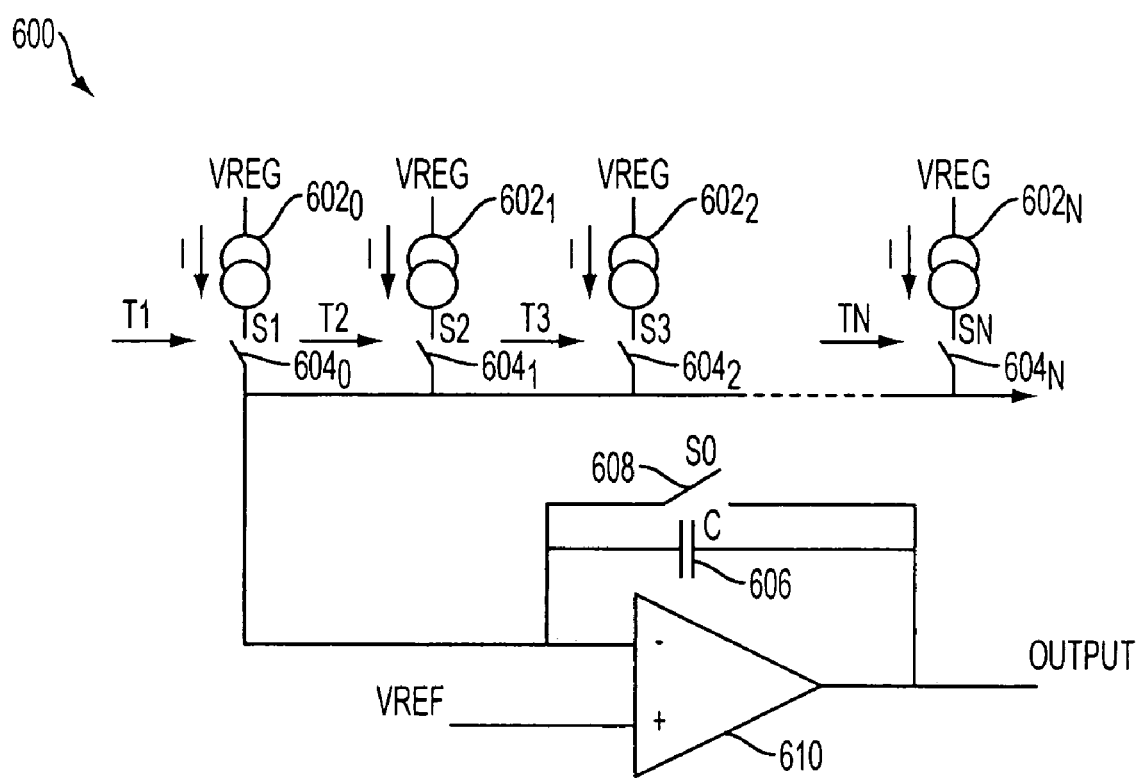
FIG. 13 illustrates a high performance modulation ramp generator constructed in accordance with an embodiment of the invention.

FIG. 13 illustrates a high performance modulation ramp generator 600 constructed in accordance with another embodiment of the invention. The generator 600 of the illustrated embodiment is more precise than the generator 570 illustrated in FIG. 12*a*. The generator 600 includes a plurality of current sources 602$_0$, 602$_1$, 602$_2$, ..., 602$_n$, first switches 604$_0$, 604$_1$, 604$_2$, ..., 604$_n$, a capacitor 606, second switch 608, and an operational amplifier 610. The current sources 602$_0$, 602$_1$, 602$_2$, ..., 602$_n$ are supplied by a regulated voltage Vreg. The operational amplifier 610 reduces loading on the input reference voltage Vref. Most importantly, the operational amplifier 610 provides a constant voltage across the constant current sources 602$_0$, 602$_1$, 602$_2$, ..., 602$_n$. The constant voltage eliminates the voltage dependence of the current sources 602$_0$, 602$_1$, 602$_2$, ..., 602$_n$. With this configuration, the polarity of the ramp 600 is dependent upon the direction of the constant current sources 602$_0$, 602$_1$, 602$_2$, ..., 602$_n$. In the illustrated embodiment, the output OUTPUT falls as the current I flows from Vreg. For a rising ramp, the currents I are sunk to the regulated voltage Vreg.

Figure 1:
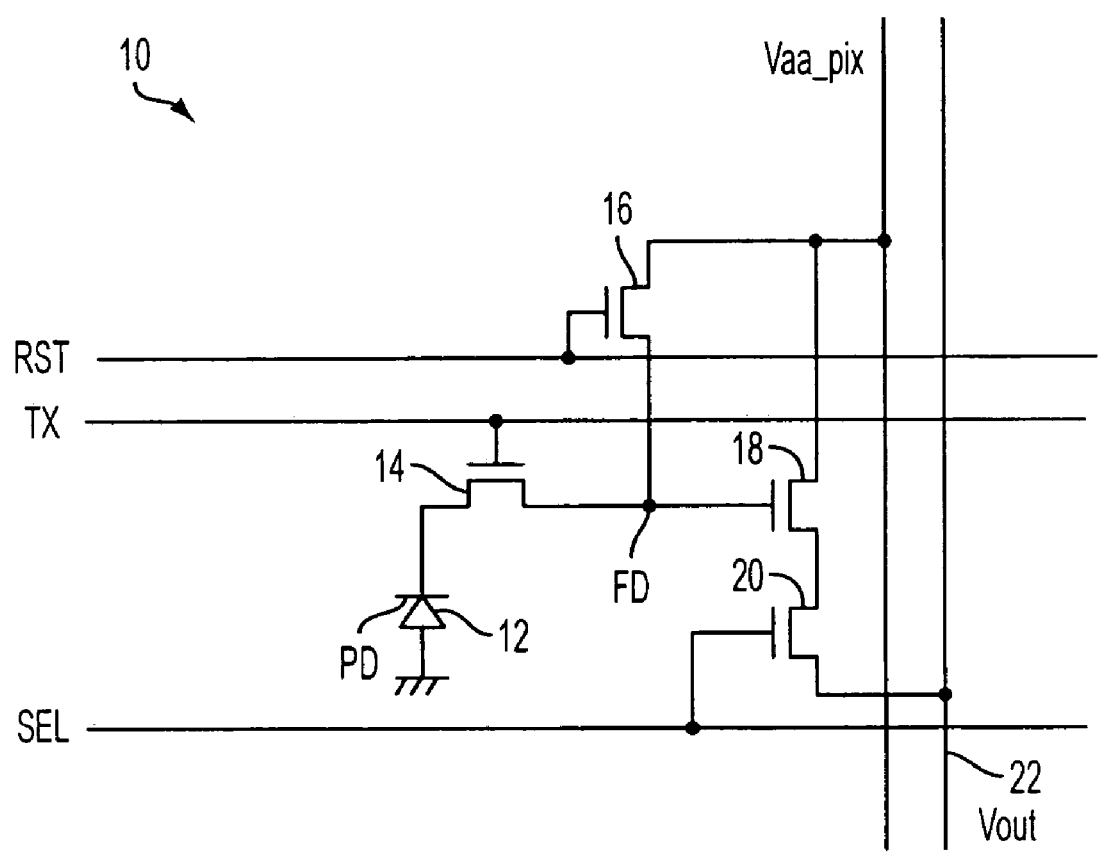
FIG. 1 illustrates a conventional imager pixel circuit.
Figure 14:
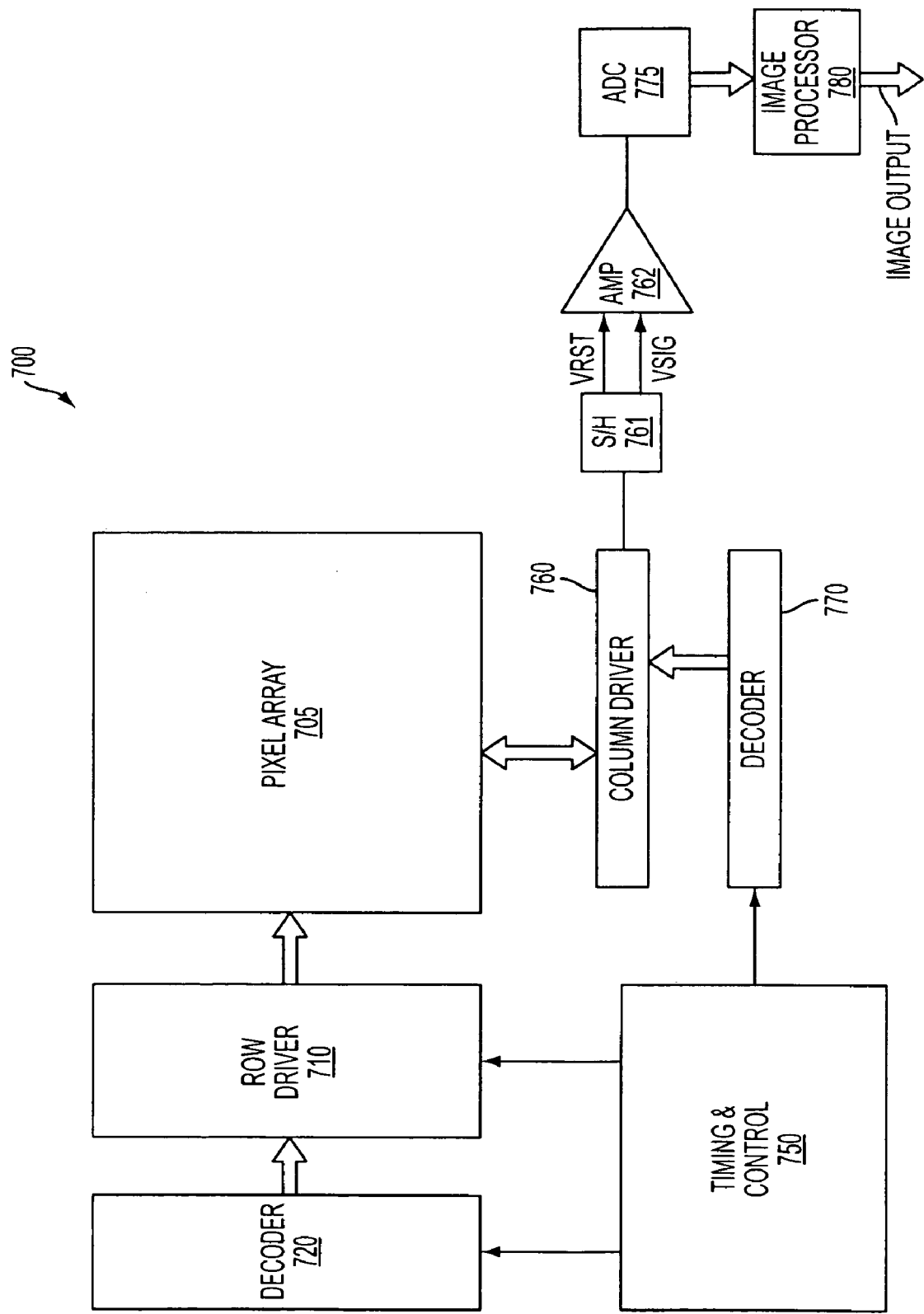
FIG. 14 shows an imager constructed in accordance with an embodiment of the invention.

FIG. 14 illustrates an exemplary imager 700 that may utilize any of the analog-to-digital converters constructed in accordance with the invention. The Imager 700 has a pixel array 705 comprising pixels constructed as described above with respect to FIG. 1, or using other pixel architectures. Row lines are selectively activated by a row driver 710 in response to row address decoder 720. A column driver 760 and column address decoder 770 are also included in the imager 700. The imager 700 is operated by the timing and control circuit 750, which controls the address decoders 720, 770. The control circuit 750 also controls the row and column driver circuitry 710, 760.

A sample and hold circuit 761 associated with the column driver 760 reads a pixel reset signal Vrst and a pixel image signal Vsig for selected pixels. A differential signal (Vrst−Vsig) is amplified by differential amplifier 762 for each pixel and is digitized by analog-to-digital converter 775 (ADC). The analog-to-digital converter 775 supplies the digitized pixel signals to an image processor 780 which forms a digital image.

Figure 15:
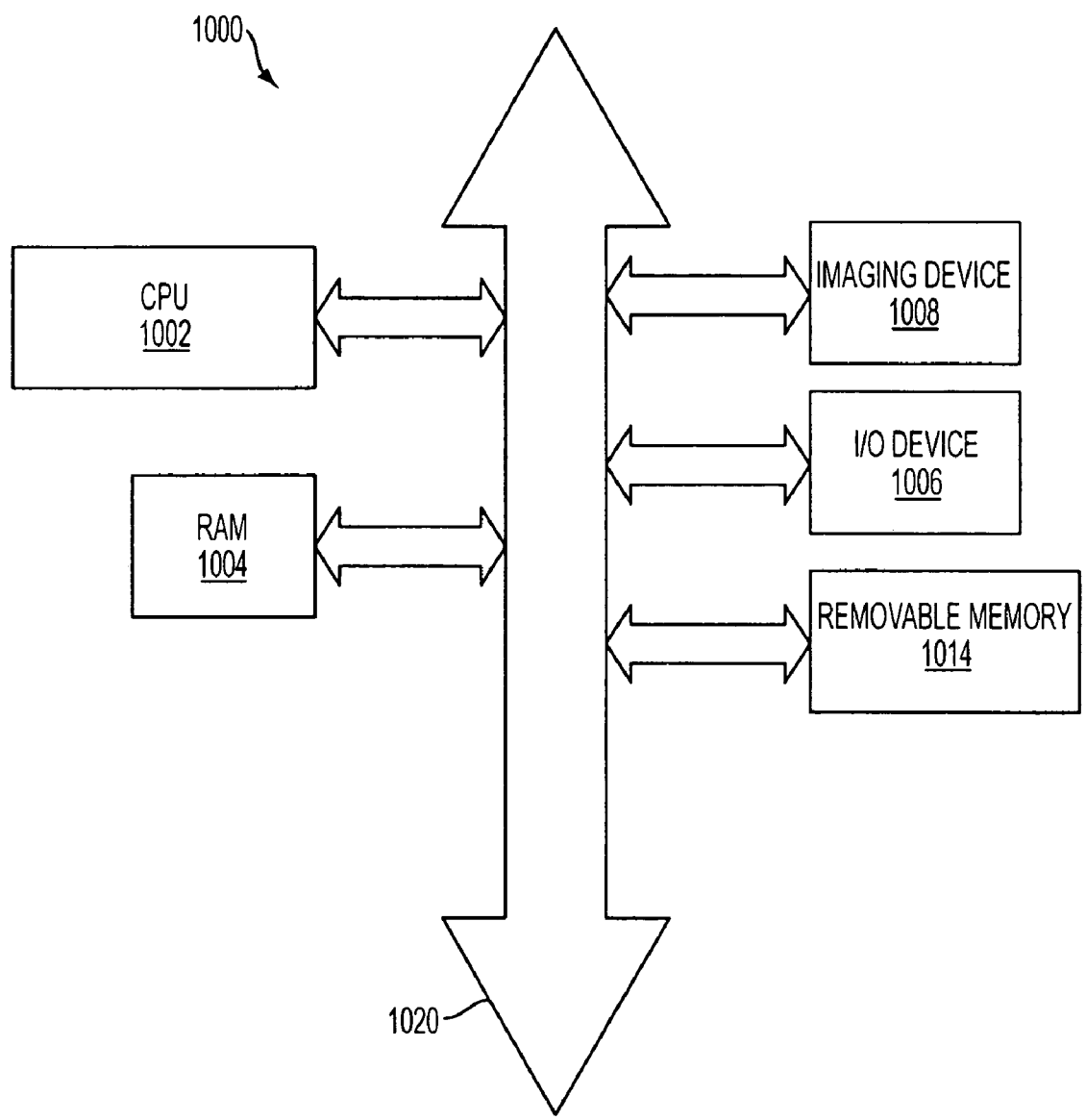
FIG. 15 shows a processor system incorporating at least one imager constructed in accordance with an embodiment of the invention.

FIG. 15 shows a system 1000, a typical processor system modified to include an imaging device 1008 (such as the imaging device 700 illustrated in FIG. 14) of the invention. The processor system 1000 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 1000, for example a camera system, generally comprises a central processing unit (CPU) 1002, such as a microprocessor, that communicates with an input/output (I/O) device 1006 over a bus 1020. Imaging device 1008 also communicates with the CPU 1002 over the bus 1020. The processor-based system 1000 also includes random access memory (RAM)1004, and can include removable memory 1014, such as flash memory, which also communicate with the CPU 1002 over the bus 1020. The imaging device 1008 may be combined with a processor, such as a CPU, digital signal processor, or microprocessor, with or without memory storage on a single integrated circuit or on a different chip than the processor.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. An analog-to-digital converter comprising:
   a ramp generator having a differential ramp voltage output;
   a comparison circuit connected to receive the differential ramp voltage output, said comparison circuit inputting first and second analog signals and generating a comparison signal when the input signals match the differential ramp voltage output; and
   a latching circuit coupled to the comparison signal, said latching circuit latching a digital code corresponding to a difference between the input first and second analog signals when the comparison signal indicates that the input signals match the differential ramp voltage output.

2. The analog-to-digital converter of claim 1 wherein said ramp generator comprises first and second ramp generator circuits, said first ramp generator circuit having a first ramp output and said second ramp generator having a second ramp output.

3. The analog-to-digital converter of claim 2, wherein the first ramp output is a falling ramp voltage and the second ramp output is a rising ramp voltage.

4. The analog-to-digital converter of claim 2, wherein the first ramp output is compared to the first analog signal and the second ramp output is compared to the second analog signal.

5. The analog-to-digital converter of claim 1, wherein said ramp generator comprises:
   a plurality of ramp unit cells having respective voltage outputs; and
   a shift register connected to the ramp unit cells, said shift register controlling an operation of the unit cells,
   wherein a combined voltage output of the ramp unit cells is used as a ramp voltage output for said ramp generator circuit.

6. The analog-to-digital converter of claim 1, wherein said ramp generator comprises a plurality of ramp unit cells and each ramp unit cell comprises:
   a rising voltage portion having a rising voltage output;
   a falling voltage portion having a falling voltage output; and
   a shift register having an output that controls said rising and falling voltage portions,
   wherein the rising voltages of each ramp unit cell are combined to form a combined rising voltage output and the falling voltages of each ramp unit cell are combined to form a combined falling voltage output, the combined voltage outputs forming the differential ramp voltage output.

7. The analog-to-digital converter of claim 6, wherein said rising voltage portion comprises:
   an inverter connected to the shift register output;
   a pair of serially connected transistors connected between a low potential and a reference potential and being controlled by the inverter output;
   a clamping circuit;
   a reset circuit connected to the clamping circuit; and
   a capacitor connected between the serially connected pair and a connection of the clamping and reset circuits, wherein charge stored on the capacitor is used as the rising voltage output.

8. The analog-to-digital converter of claim 7, wherein the pair of serially connected transistors comprises a p-channel transistor used to pull the rising voltage output to the reference potential at an end of a ramp operation.

9. The analog-to-digital converter of claim 6, wherein said falling voltage portion comprises:
   an inverter connected to the shift register output;
   a pair of serially connected transistors connected between a high potential and a reference potential and being controlled by the inverter output;
   a clamping circuit;
   a reset circuit connected to the clamping circuit; and
   a capacitor connected between the serially connected pair and a connection of the clamping and reset circuits, wherein charge stored on the capacitor is used as the falling voltage output.

10. The analog-to-digital converter of claim 9, wherein the pair of serially connected transistors comprises an n-channel transistor used to pull the falling voltage output to the reference potential at an end of a ramp operation.

11. The analog-to-digital converter of claim 1, wherein the ramp voltage output is linear.

12. The analog-to-digital converter of claim 1, wherein the ramp voltage output is non-linear.

13. The analog-to-digital converter of claim 1, wherein said ramp generator is a multi-mode ramp generator.

14. The analog-to-digital converter of claim 13, wherein said ramp generator comprises a plurality of ramp unit cells, said cells being organized into a plurality of rows, wherein half of said rows are arranged in a first direction and half of said rows are arranged in a second direction.

15. The analog-to-digital converter of claim 14, wherein an output of a row arranged in the first direction is used as an input for a row arranged in the second direction.

16. The analog-to-digital converter of claim 14, wherein an output of a row arranged in the second direction is used as an input for a row arranged in the first direction.

17. The analog-to-digital converter of claim 14, wherein a combined voltage output of the rows is used as the ramp voltage output.

18. The analog-to-digital converter of claim 17, wherein the rows are connected such that the ramp voltage output is linear.

19. The analog-to-digital converter of claim 17, wherein the rows are connected such that the ramp voltage output is compressed.

20. The analog-to-digital converter of claim 13, wherein said ramp generator has multiple compressed operating modes, each compressed operating mode having a programmable break point.

21. The analog-to-digital converter of claim 20, wherein said ramp generator comprises a plurality of current sources and said break points are programmed by switching in current sources.

22. An analog-to-digital converter comprising:
a multimode ramp generator having a multimode ramp voltage output;
a comparison circuit connected to receive the multimode ramp voltage output, said comparison circuit inputting an analog signal and generating a comparison signal when the input signal matches the multimode ramp voltage output; and
a latching circuit coupled to the comparison signal, said latching circuit latching a digital code corresponding to the input analog signal.

23. The analog-to-digital converter of claim 22, wherein the ramp voltage output is linear.

24. The analog-to-digital converter of claim 22, wherein the ramp voltage output is non-linear.

25. The analog-to-digital converter of claim 22, wherein said ramp generator comprises a plurality of ramp unit cells, said cells being organized into a plurality of rows, wherein half of said rows are arranged in a first direction and half of said rows are arranged in a second direction.

26. The analog-to-digital converter of claim 25, wherein an output of a row arranged in the first direction is used as an input for a row arranged in the second direction.

27. The analog-to-digital converter of claim 25, wherein an output of a row arranged in the second direction is used as an input for a row arranged in the first direction.

28. The analog-to-digital converter of claim 25, wherein a combined voltage output of the rows is used as the ramp voltage output.

29. The analog-to-digital converter of claim 28, wherein the rows are connected such that the ramp voltage output is linear.

30. The analog-to-digital converter of claim 28, wherein the rows are connected such that the ramp voltage output is compressed.

31. The analog-to-digital converter of claim 22, wherein said ramp generator has multiple compressed operating modes, each compressed operating mode having a programmable break point.

32. The analog-to-digital converter of claim 31, wherein said ramp generator comprises a plurality of current sources and said break points are programmed by switching in current sources.

33. An imaging device comprising:
an array of pixels, said array outputting analog signals; and
an analog-to-digital converter coupled to the array, said analog-to-digital converter comprising:
a ramp generator having a differential ramp voltage output,
a comparison circuit connected to receive the differential ramp voltage output, said comparison circuit inputting first and second analog signals and generating a comparison signal when the input signals match the differential ramp voltage output, and
a latching circuit coupled to the comparison signal, said latching circuit latching a digital code corresponding to a difference between the input first and second analog signals when the comparison signal indicates that the input signals match the differential ramp voltage output.

34. The device of claim 33, wherein said ramp generator comprises first and second ramp generator circuits, said first ramp generator circuit having a first ramp output and said second ramp generator having a second ramp output.

35. The device of claim 34, wherein the first ramp output is a falling ramp voltage and the second ramp output is a rising ramp voltage.

36. The device of claim 35, wherein the first ramp output is compared to the first analog signal and the second ramp output is compared to the second analog signal.

37. The device of claim 33, wherein said ramp generator comprises:
a plurality of ramp unit cells having respective voltage outputs; and
a shift register connected to the ramp unit cells, said shift register controlling an operation of the unit cells,
wherein a combined voltage output of the ramp unit cells is used as a ramp voltage output for said ramp generator circuit.

38. The device of claim 33, wherein said ramp generator comprises a plurality of ramp unit cells and each ramp unit cell comprises:
a rising voltage portion having a rising voltage output;
a falling voltage portion having a falling voltage output; and
a shift register having an output that controls said rising and falling voltage portions,
wherein the rising voltages of each ramp unit cell are combined to form a combined rising voltage output and the falling voltages of each ramp unit cell are combined to form a combined falling voltage output, the combined voltage outputs forming the differential ramp voltage output.

39. The device of claim 38, wherein said rising voltage portion comprises:
an inverter connected to the shift register output;
a pair of serially connected transistors connected between a low potential and a reference potential and being controlled by the inverter output;
a clamping circuit;
a reset circuit connected to the clamping circuit; and a capacitor connected between the serially connected pair and a connection of the clamping and reset circuits, wherein charge stored on the capacitor is used as the rising voltage output.

40. The device of claim 39, wherein the pair of serially connected transistors comprises a p-channel transistor used to pull the rising voltage output to the reference potential at an end of a ramp operation.

41. The device of claim 39, wherein said falling voltage portion comprises:
an inverter connected to the shift register output;
a pair of serially connected transistors connected between a high potential and a reference potential and being controlled by the inverter output;
a clamping circuit;
a reset circuit connected to the clamping circuit; and
a capacitor connected between the serially connected pair and a connection of the clamping and reset circuits, wherein charge stored on the capacitor is used as the falling voltage output.

42. The device of claim 41, wherein the pair of serially connected transistors comprises an n-channel transistor used to pull the falling voltage output to the reference potential at an end of a ramp operation.

43. The device of claim 33, wherein the ramp voltage output is linear.

44. The device of claim 33, wherein the ramp voltage output is non-linear.

45. The device of claim 33, wherein said ramp generator is a multi-mode ramp generator.

46. The device of claim 45, wherein said ramp generator comprises a plurality of ramp unit cells, said cells being organized into a plurality of rows, wherein half of said rows are arranged in a first direction and half of said rows are arranged in a second direction.

47. The device of claim 46, wherein an output of a row arranged in the first direction is used as an input for a row arranged in the second direction.

48. The device of claim 46, wherein an output of a row arranged in the second direction is used as an input for a row arranged in the first direction.

49. The device of claim 46, wherein a combined voltage output of the rows is used as the ramp voltage output.

50. The device of claim 49, wherein the rows are connected such that the ramp voltage output is linear.

51. The device of claim 49, wherein the rows are connected such that the ramp voltage output is compressed.

52. The device of claim 45, wherein said ramp generator has multiple compressed operating modes, each compressed operating mode having a programmable break point.

53. The device of claim 52, wherein said ramp generator comprises a plurality of current sources and said break points are programmed by switching in current sources.

54. An imaging device comprising:
an array of pixels, said array outputting analog signals; and
an analog-to-digital converter coupled to the array, said analog-to-digital converter comprising:
a multimode ramp generator having a multimode ramp voltage output,
a comparison circuit connected to receive the multimode ramp voltage output, said comparison circuit inputting an analog signal and generating a comparison signal when the input signal matches the multimode ramp voltage output, and
a latching circuit coupled to the comparison signal, said latching circuit latching a digital code corresponding to the input analog signal.

55. The device of claim 54, wherein the ramp voltage output is linear.

56. The device of claim 54, wherein the ramp voltage output is non-linear.

57. The device of claim 54, wherein said ramp generator comprises a plurality of ramp unit cells, said cells being organized into a plurality of rows, wherein half of said rows are arranged in a first direction and half of said rows are arranged in a second direction.

58. The device of claim 57, wherein an output of a row arranged in the first direction is used as an input for a row arranged in the second direction.

59. The device of claim 57, wherein an output of a row arranged in the second direction is used as an input for a row arranged in the first direction.

60. The device of claim 57, wherein a combined voltage output of the rows is used as the ramp voltage output.

61. The device of claim 60, wherein the rows are connected such that the ramp voltage output is linear.

62. The device of claim 60, wherein the rows are connected such that the ramp voltage output is compressed.

63. The device of claim 54, wherein said ramp generator has multiple compressed operating modes, each compressed operating mode having a programmable break point.

64. The device of claim 63, wherein said ramp generator comprises a plurality of current sources and said break points are programmed by switching in current sources.

65. A processor system comprising:
a processor; and
an imaging device coupled to said process and comprising an array of pixels and an analog-to-digital converter coupled to said array, said array outputting analog signals, said analog-to-digital converter comprising:
a ramp generator having a differential ramp voltage output,
a comparison circuit connected to receive the differential ramp voltage output, said comparison circuit inputting first and second analog signals and generating a comparison signal when the input signals match the differential ramp voltage output, and
a latching circuit coupled to the comparison signal, said latching circuit latching a digital code corresponding to a difference between the input first and second analog signals when the comparison signal indicates that the input signals match the differential ramp voltage output.

66. A processor system comprising:
a processor; and
an imaging device coupled to said processor and comprising an array of pixels and an analog-to-digital converter coupled to said array, said array outputting analog signals, said analog-to-digital converter comprising:
a multimode ramp generator having a multimode ramp voltage output,
a comparison circuit connected to receive the multimode ramp voltage output, said comparison circuit inputting an analog signal and generating a comparison signal when the input signal matches the multimode ramp voltage output, and
a latching circuit coupled to the comparison signal, said latching circuit latching a digital code corresponding to the input analog signal.

67. A method of operating a ramp generator to be used with an analog-to-digital converter, said method comprising:
organizing a plurality ramp unit cells into a first configuration based on a first operating mode; and
combing the outputs of the ramp unit cells to form a ramp voltage output,
wherein the ramp generator has multiple compressed operating modes, each compressed operating mode has a programmable break point.

68. The method of claim 67, wherein the organizing act comprises switchingly connecting a predetermined number of ramp unit cells based on the first operating mode.

69. The method of claim 67, wherein the ramp generator comprises a plurality of current sources and said break points are programmed by switching in current sources.

70. A method of operating a ramp generator to be used with an analog-to-digital converter, said method comprising:
organizing a plurality ramp unit cells into a first configuration based on a first operating mode; and
combing the outputs of the ramp unit cells to form a ramp voltage output,
wherein the cells are organized into a plurality of rows, half of said rows are arranged in a first direction and half of said rows are arranged in a second direction.

71. The method of claim 70, wherein an output of a row arranged in the first direction is used as an input for a row arranged in the second direction.

72. The method of claim 70, wherein an output of a row arranged in the second direction is used as an input for a row arranged in the first direction.

73. The method of claim 70, wherein the rows are connected such that the ramp voltage output is linear.

74. The device of claim 70, wherein the rows are connected such that the ramp voltage output is compressed.

* * * * *

UNITED STATES PATENT AND TRADEMARK OFFICE
CERTIFICATE OF CORRECTION

PATENT NO. : 7,075,470 B2
APPLICATION NO. : 11/055102
DATED : July 11, 2006
INVENTOR(S) : Yan Lee Page 1 of 1

It is certified that error appears in the above-identified patent and that said Letters Patent is hereby corrected as shown below:

In the Specification, the following errors are corrected:

Column 5, line 12, "$CELL_{11}$" should read --$CELL_{1,}$--; and

Column 14, line 29, "lined" should read --line--.

In the Claims, the following error is corrected:

Claim 70, column 21, line 18, "plurality ramp" should read --plurality of ramp--.

Signed and Sealed this

Sixth Day of March, 2007

JON W. DUDAS
*Director of the United States Patent and Trademark Office*

UNITED STATES PATENT AND TRADEMARK OFFICE
CERTIFICATE OF CORRECTION

PATENT NO. : 7,075,470 B2  Page 1 of 1
APPLICATION NO. : 11/055102
DATED : July 11, 2006
INVENTOR(S) : Yan Lee It is certified that error appears in the above-identified patent and that said Letters Patent is hereby corrected as shown below:

In the Claims, the following errors are corrected:

Claim 67, column 21, line 5, "combing" should read --combining--; and

Claim 70, column 22, line 1, "combing" should read --combining--.

Signed and Sealed this

Twenty-eighth Day of August, 2007

JON W. DUDAS
*Director of the United States Patent and Trademark Office*